(12) United States Patent

Chase et al.

(10) Patent No.: US 12,646,828 B2

(45) Date of Patent: Jun. 2, 2026

(54) TELECOMMUNICATION EQUIPMENT STRUCTURE

(71) Applicant: ORIGIN Engineering LLC, Windsor, CO (US)

(72) Inventors: Matthew J. Chase, Windsor, CO (US); Brandon King, Johnstown, CO (US)

( * ) Notice: Subject to any disclaimer, the term of this patent is extended or adjusted under 35 U.S.C. 154(b) by 87 days.

(21) Appl. No.: 18/888,531

(22) Filed: Sep. 18, 2024

(65) Prior Publication Data

US 2026/0081349 A1 Mar. 19, 2026

(51) Int. Cl.
| | |
|---|---|
| *H01Q 1/42* | (2006.01) |
| *H05K 5/02* | (2006.01) |
| *H05K 5/13* | (2025.01) |

(52) U.S. Cl.
CPC ............ *H01Q 1/42* (2013.01); *H05K 5/0213* (2013.01); *H05K 5/13* (2025.01)

(58) Field of Classification Search
CPC .......... H01Q 1/42; H05K 5/0213; H05K 5/13
See application file for complete search history.

(56) References Cited

U.S. PATENT DOCUMENTS

| | | | | |
|---|---|---|---|---|
| 10,411,336 | B1 * | 9/2019 | Schwartz ................. | H01Q 1/12 |
| 11,380,987 | B2 * | 7/2022 | Kim ........................ | H01Q 1/08 |
| 11,909,093 | B2 * | 2/2024 | Lockwood ............. | H01Q 21/28 |
| 2016/0248144 | A1 * | 8/2016 | Stauffer ............... | H01Q 1/1242 |
| 2022/0069434 | A1 | 3/2022 | Chase | |
| 2022/0248556 | A1 | 8/2022 | Chase | |

* cited by examiner

*Primary Examiner* — Seung H Lee

(74) *Attorney, Agent, or Firm* — Trenner Law Firm, LLC; Mark Trenner

(57) ABSTRACT

An example equipment structure includes an outer wall for deployment at least partially below the surface of the ground. An inner casing is provided within the outer wall and forms an interstitial space between the inner casing and the outer wall. The inner casing provides a protective barrier for an equipment cavity formed within the inner casing. A lid covers the equipment cavity for electronics equipment. A riser column is mounted in the equipment cavity formed within the inner casing. The riser column has a backplane to mount the electronics equipment thereto. The riser column is configured to move between a first lowered position in the equipment cavity formed within the inner casing, and a second raised position for access to the electronics equipment mounted to the backplane.

20 Claims, 29 Drawing Sheets

TELECOMMUNICATION EQUIPMENT STRUCTURE

BACKGROUND

To make wireless communications services (e.g., 5G and future generation protocols) a reality, small cell sites are being installed to provide coverage. These 5G small cell sites must be lower to the ground and in closer proximity to one another than previous generations of wireless telecommunications. In dense, urban areas, 5G small cell sites are being installed all over city streets, buildings, and neighborhoods. To avoid clutter, highly integrated structures are needed to meet the requirements for providing wireless service while minimizing disruption during installation and repairs. These integrated structures will become common in the landscape and thus need to fit in seamlessly with the surroundings, while complying with local, state, and federal ordinances, and still being based on standards for manufacturing and installation.

DETAILED DESCRIPTION

Figure 1:
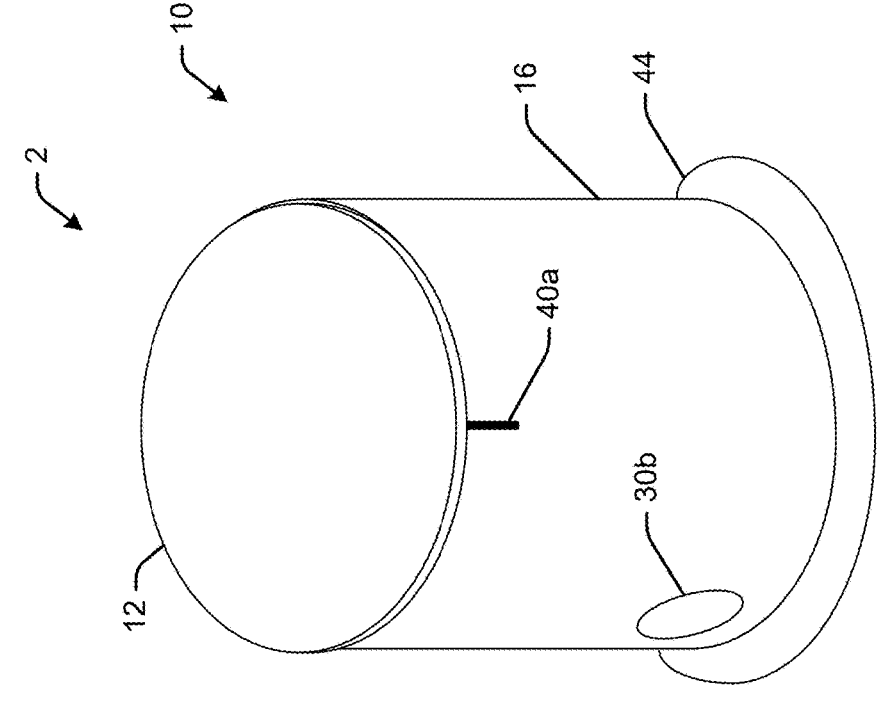
FIG. 1 shows isometric views of an example telecommunication equipment structure in both a raised position and a lowered position.
Figure 1:
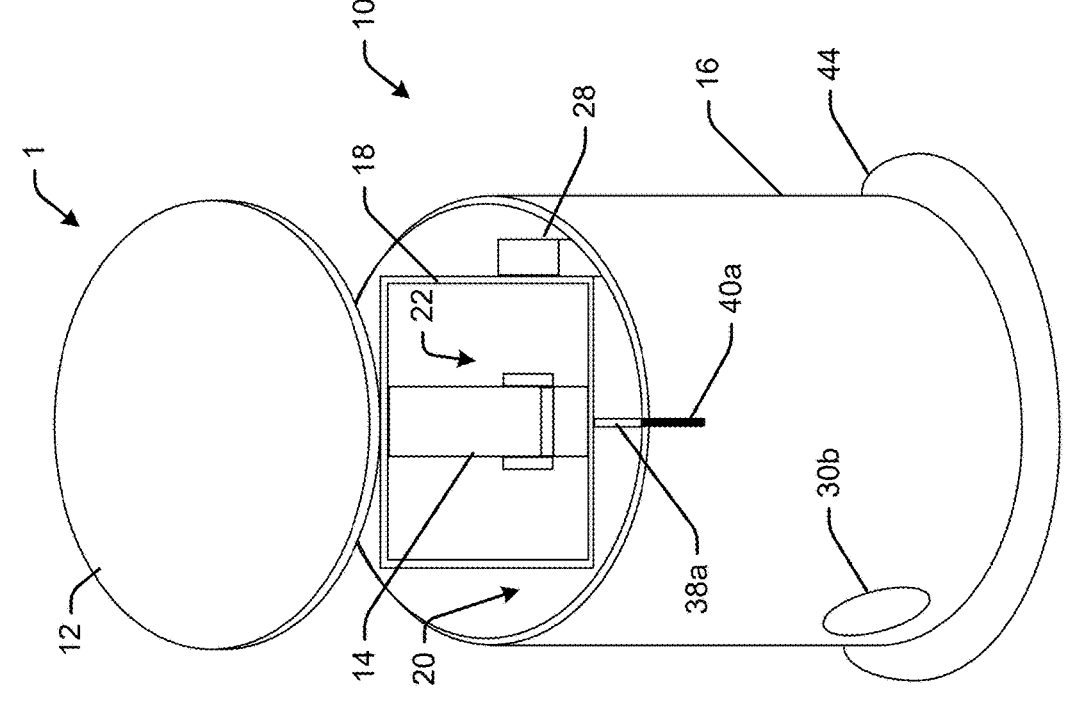

Cabinets for mounting telecommunications equipment are typically mounted to buildings and utility poles, which can give an unsightly appearance. In addition, access to the interior space may be difficult with traditional installations in small cabinets. A telecommunication equipment structure is disclosed herein which provides a cost effective solution that can be installed in the ground, all while eliminating access issues, water penetrating issues, and is aesthetically pleasing.

In an example, the telecommunication structure is implemented as an in-ground cabinet that may house small cell telecommunication devices and associated electronics. Of course, the structure is not limited only to house small cell telecommunication equipment. Other applications of the structure will also be apparent to those having ordinary skill in the art after becoming familiar with the teachings herein, and the scope of this disclosure is not intended to be limited to any particular end-use.

The cabinet may be installed in any suitable location. By way of illustration, the telecommunication structure is described herein as it may be installed in the ground for example, so that the lid is flush with the surface of the ground (e.g., a sidewalk, roadway, concrete or paved pad, or even in the dirt or a gravel area). The telecommunication structure is suitable for installation outdoors (as water management may be provided), but may also be installed indoors or under a cover.

The example electronics equipment structure has four distinct subassemblies, namely, the outer wall, a modular cartridge, an internal drive column, and a lid. All of these are utilized together to create a functional underground containment area for equipment mounting. Airflow management may be provided for cooling the electronics equipment mounted therein. Water management may also be provided for maintaining a dry interior space for the electronics equipment.

In an example, an inner casing is provided within the outer wall and forms an interstitial space between the inner casing and the outer wall. The inner casing provides a protective barrier for an equipment cavity formed within the inner casing. The interstitial space may be filled with washed stone or other natural or synthetic media. An intake chamber provides for passage of cooler air into the equipment cavity formed within the inner casing. A separate exhaust chamber provides for passage of warmer air out of the equipment cavity formed within the inner casing.

In an example, the system is at least partly modular, meaning that the casing can be installed prior to installation of the internal components. The internal components may be readily installed, services, and/or replaced (e.g., as modular cartridges). A cartridge system provides a solution for future upgrades and maintenance.

A riser column having a stationary base structure and a movable riser structure is provided within the equipment cavity. The movable riser structure moves relative to the stationary base structure between a lowered or closed position and a raised position (e.g., for providing ready access to the electronics equipment). A backplane is provided to mount electronics equipment in the equipment cavity. The riser column is configured to move between the lowered position and the raised position for access to the electronics equipment mounted in the equipment cavity.

In an example, the electronics equipment structure may have a lid that attaches directly to the riser column for security and for ease of service. A mechanical riser can be provided so that no additional electrical power or motor needs to be provided in order to raise the equipment for access, servicing, and/or replacement. In an example, the riser operates off of a slide rail. Gears and gear tracks, ratched systems, and other mechanisms may also be provided. Of course, a motorized mechanism may also be provided. Regardless of the mechanism, being able to raise the cartridge for servicing and replacement eliminates having to work in a confined space.

In an example, the electronics equipment structure has a drainage system to reduce or altogether eliminate water accumulation within the containment area. The example electronics equipment structure may include a French drain (gutter) catch basin and/or an industrial sump pump system.

In an example, the electronics equipment structure has an isolated exhaust and intake ventilation. An outer wall and inner casing enable installation in loose soil conditions.

In an example, the electronics equipment structure can be manufactured using a variety of shapes, materials, and configurations, and is not limited to any particular manufacturing technique (e.g., welding, machine forming, injection molding, etc.). For example, bump broke sheet metal and pipe, cast steel, and even fiberglass or other composite materials may be utilized. Again, the electronics equipment structure and components thereof are not limited to any particular type, shape, materials, configuration, or method of manufacture.

The electronics equipment structure can be provided in varying depths and outer diameters, e.g., based on various design considerations, such as but not limited to, the size and/or type of equipment being installed, the location, and regulatory and other requirements. In an example, the electronics equipment structure can be provided with various sizes (e.g., diameter and depth) to provide cabinet space for single carrier or multiple carrier equipment. Example depths include 4', 6', 8', and 12' depths below ground level. In an example, the electronics equipment structure can be installed underground (e.g., in a sidewalk or walkway, street or roadway, or dedicated space) so that it is not readily visible and/or is visually appealing.

In addition, the electronics equipment structure can be any suitable shape (e.g., square, round, keyhole shaped with both a round and square portion, etc.). Likewise, the electronics equipment structure can be configured for use with any number of telecommunications carriers (e.g., a single carrier, or multiple different carriers in the same structure).

Before continuing, it is noted that as used herein, the terms "includes" and "including" mean, but is not limited to, "includes" or "including" and "includes at least" or "including at least." The term "based on" means "based on" and "based at least in part on."

It is also noted that the examples described herein are provided for purposes of illustration, and are not intended to be limiting. By way of illustration, the small cell telecommunication structure is not limited to use with any particular equipment or to any particular installation location. Other devices and/or device configurations may be utilized to carry out the operations described herein.

Figure 2:
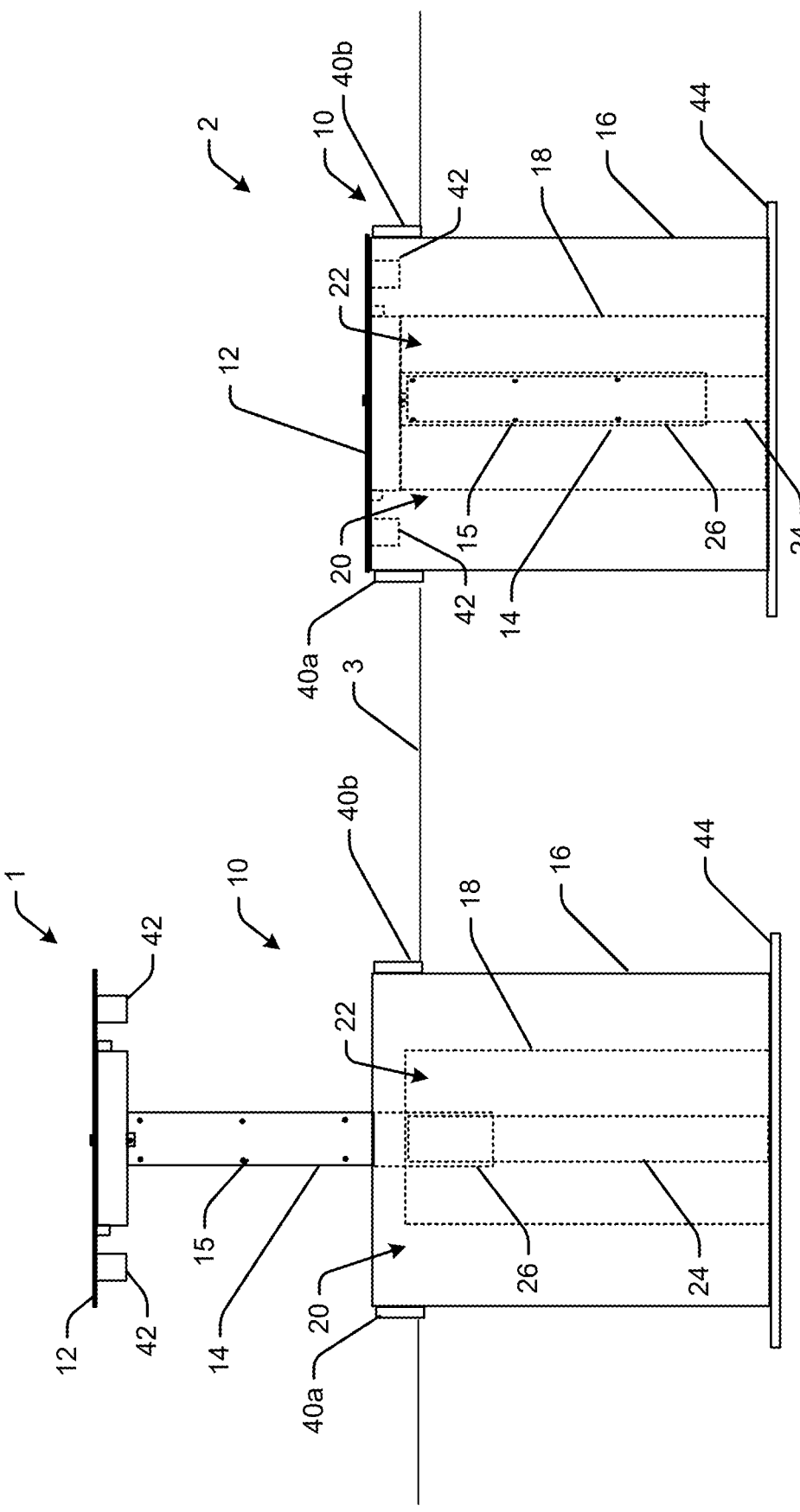
FIG. 2 shows side views of the example telecommunication equipment structure in both a raised position and a lowered position.
Figure 3:
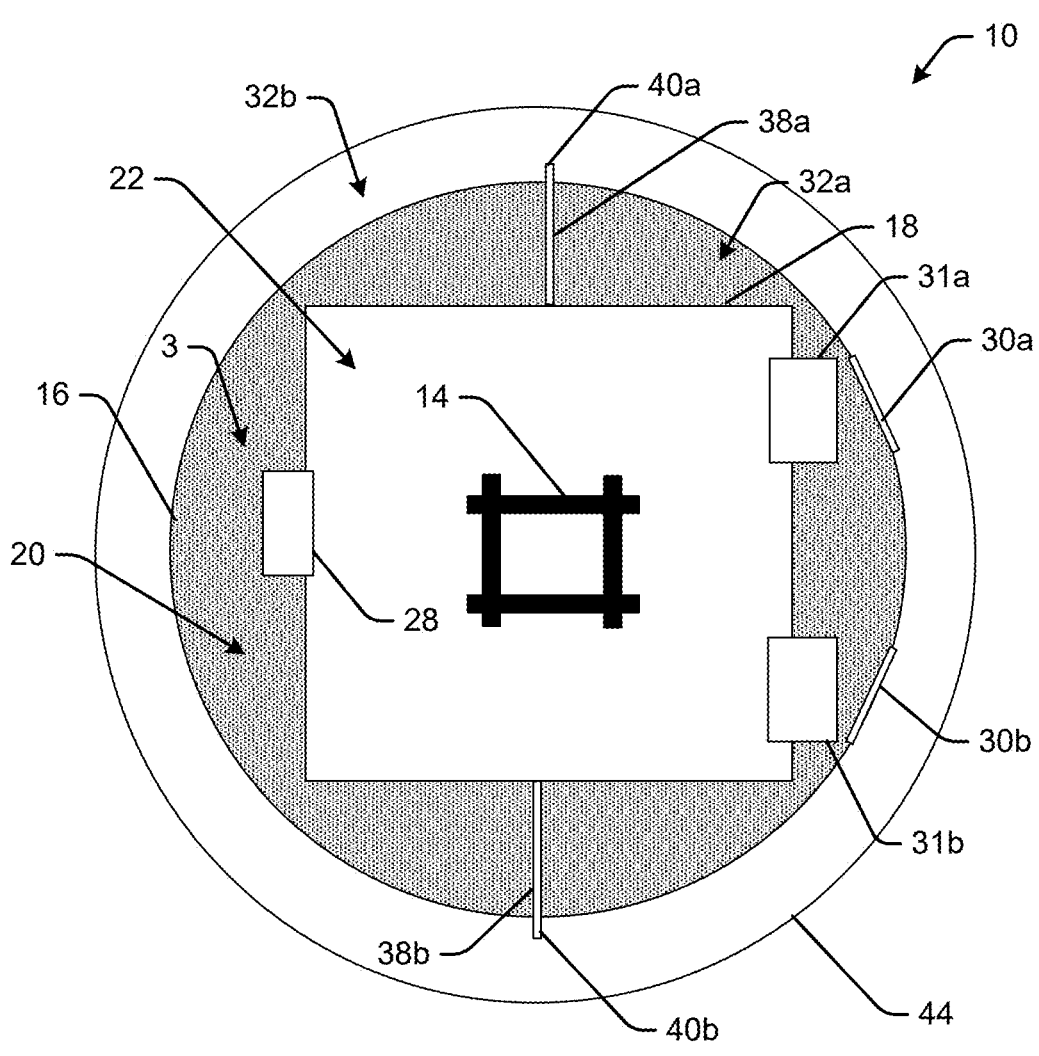
FIG. 3 is a high-level illustration of a top view looking down under a lid of the example telecommunication equipment structure.

FIG. 1 shows isometric views of an example telecommunication equipment structure 10 in both a raised position 1 and a lowered position 2. In the raised position, the lid 12 rises above ground level with a riser column 14 to provide access to equipment therein. FIG. 2 shows side views of the example telecommunication equipment structure 10 in both a raised position 1 and a lowered position 2. FIG. 3 is a top down view of the example telecommunication equipment structure looking under the lid 12.

An example telecommunication equipment structure 10 includes an outer wall 16 for deployment at least partially below the surface of the ground (illustrated by reference 3 in FIG. 2). The telecommunication equipment structure 10 may be installed at any suitable depth, such as with the lid 12 substantially flush with the surface of the ground, with the lid 12 at least partially above the surface of the ground, and/or with the outer wall 16 also at least partially above the surface of the ground.

The example telecommunication equipment structure 10 includes an inner casing 18 provided within the outer wall 16. An interstitial space 20 (or spaces) is formed between the inner casing 18 and the outer wall 16. The interstitial space 20 can be configured to be at least partly filled with washed stone 3 or other suitable media that provides for the passage of water or drainage and/or airflow therethrough.

The inner casing 18 provides a protective barrier for an equipment cavity 22 formed within the inner casing 18. The lid 12 covers at least the equipment cavity 22 for telecommunication equipment mounted therein (e.g., to the riser column 14). The riser column 14 can be mounted in the equipment cavity 22 formed within the inner casing 18. In an example, the riser column 14 has a backplane 15 or other mounting structure to mount the electronics equipment thereto.

In an example, the riser column 14 is configured to move between a lowered or closed position (e.g., reference 2 in FIGS. 1 and 2) in the equipment cavity 22 formed within the inner casing 18, and raised or open position (e.g., reference 1 in FIGS. 1 and 2). The at least partially or fully raised position provides for access (e.g., by an installer or technician) to the telecommunication equipment mounted to the backplane 15 of the riser column 14.

In an example, the riser column 14 has a stationary base structure 24 and a movable riser structure 26. The movable riser structure 26 moves relative to the stationary base structure 24 between the first lowered position and the second raised position. By way of illustration, raising the lid 12 (e.g, by manually lifting the lid 12), also raises the movable riser structure 26 in an upward direction on the stationary base structure 24. Lowering the lid 12 (e.g., manually), also lowers the movable riser structure 26 in a downward direction on the stationary base structure 24. While manual operation is described herein, it will be readily appreciated by those having ordinary skill in the art after becoming familiar with the teachings herein, that operation may be automated (e.g., via one or more electric motor or tool such as a cordless drill).

In an example, the inner casing 18 provides for a removable and interchangeable cartridge assembly or column. The column or movable riser structure 14 can be interchanged with another column (e.g., already including electronics equipment mounted thereto) to accommodate quick and easy change out of different equipment, and for servicing the equipment from above the ground level.

The movable riser structure 14 can also include a backplane 15 having a mounting surface (e.g., a pegboard like and/or bracket structure) to enable easy changes to the equipment mounted thereto.

In an example, the telecommunication equipment structure 10 includes an air intake channel 28 on the inner casing 18 for mounting one or more fans 37 or blowers. Openings 30a and 30b through the inner casing 18 also provide for airflow through the interstitial space 20 and the interior equipment cavity 22.

Figure 4:
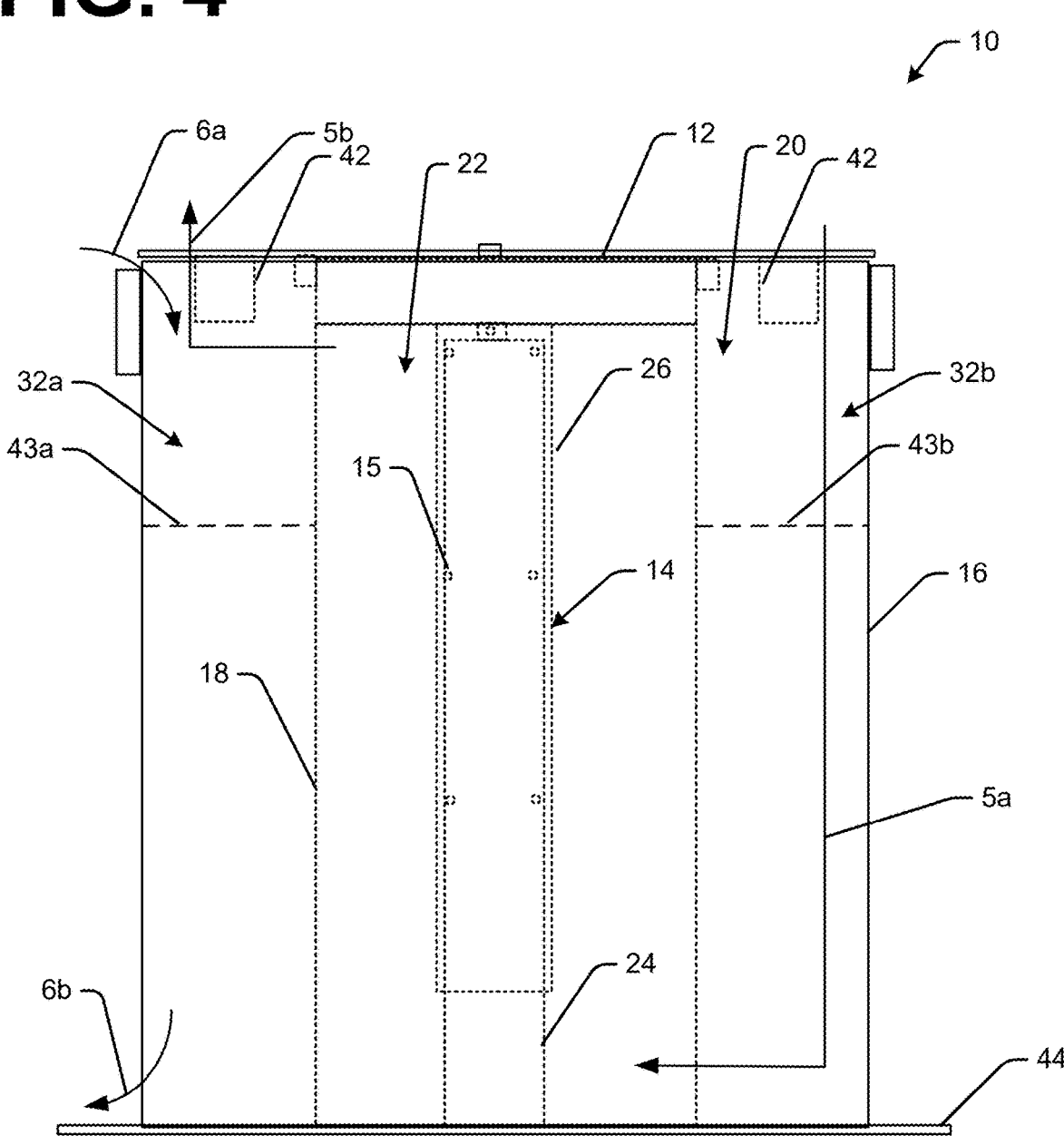
FIG. 4 is a side view of the example telecommunication equipment structure illustrating airflow handling and water handling.

FIG. 4 is a side view of the example telecommunication equipment structure 10 illustrating management of airflow and water drainage. The example telecommunication equipment structure 10 may be configured so that rain or other water drainage into the interstitial space 20 flows into a catch basin, while air flows into and out of interior equipment cavity 22 to cool the electronics equipment installed on the backplane 15 of the movable riser column 14 or as a main equipment cartridge.

In an example, the fans 37 may be installed within the interstitial space 20, e.g., to the movable riser column and/or to the interior and/or exterior of the inner casing 18. The fans 37 can also be raised (separately or with the riser column 14) and accessed from above the ground surface for repair, maintenance, or replacement.

In an example, the example telecommunication equipment structure 10 is configured with split chambers 32a and 32b, as illustrated in FIG. 4. The split chambers may be formed by extension walls 38a and 38b of the inner casing 18 connected by clips 40a and 40b so as to maintain contact with the interior side of the outer wall 16. The split configuration of the interstitial space 20 provides separate chambers 32a and 32b or pathways for air intake and exhaust airflow. The split chambers 32a and 32b provide at least a first cold air intake chamber and a second heated air exhaust chamber for moving cooler air into the equipment cavity 22 formed within the inner casing 18, and moving warmer air out of the equipment cavity 22 formed within the inner casing 18. This configuration allows air to pass fully through the equipment cavity 22, past the movable riser column 14 and the equipment installed thereon, and out through the interstitial space 20 and the ventilation in the lid 12 to be exhausted to the surrounding environment, as illustrated in FIG. 4 by arrows 5a and 5b.

During example operation, the ventilation fan(s) 37 move outside air taken in from openings 34a formed in the lid 12 and into the equipment cavity 22 to cool the electronics equipment therein. At least a first vent opening 30a, 30b is formed through the inner casing for moving outside air into the equipment cavity 22. A second vent opening 36 is provided through the inner casing 18 via the interstitial space 20 (e.g., exhaust chamber 32b) to the openings 34b formed in the lid 12 for expelling warmer air out of the equipment cavity 22 to cool the electronics equipment therein.

Figure 7:
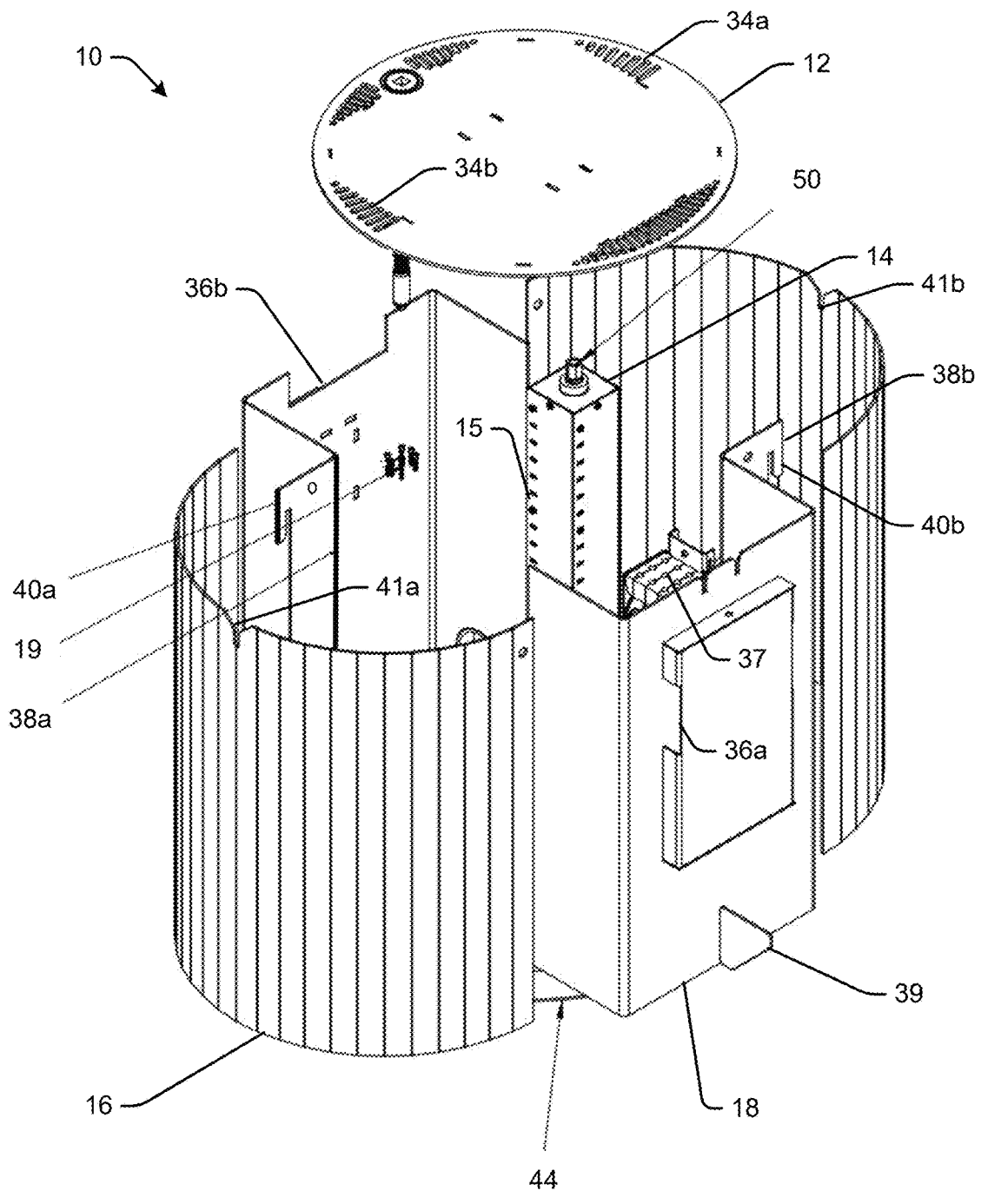
FIG. 7 is a partially exploded isometric view of the outer wall and inner casing of the example telecommunication equipment structure.

During example operation, the electronics equipment structure 10 circulates air and cools internal electronics by pulling in air through and under the lid 12 (e.g., via fan channels 36a on the inner casing 18). The lid 12 may have multiple cutouts 34a as seen in FIG. 7 for cold air to enter, and multiple cutouts 34b in the lid for hot air to exit. The hot and cold air is separated by an intake chamber 32a and an exhaust chamber 32b formed by two extended walls 38a and 38b on the inner casing 18, in the interstitial space 20 between the inner casing 18 and outer wall 16. The walls 38a and 38b can be mounted to the outer wall 16 via hooks 40a and 40b formed in the walls 38a and 38b, respectively, of the inner casing 18. Fans 37 draw the air in through the lid, and under a rain guard 42 provided under the lid 12. Subsequent fans (e.g., additional fan(s) installed within the equipment chamber 22) move the intake air through and across the moveable riser column 14, collecting heat, and exiting out the top through a cutout 36b in the inner casing 18, under the rainguard 42, and then out through the openings 34b in the lid 12.

After installation, water may flow into the telecommunication equipment structure 10, for example as illustrated by arrow 6a into the interstitial space 20 around the upper perimeter of the outer wall 16. In an example, the outer wall 16 has at least one drain opening 30a, 30b formed therethrough to remove water as illustrated by arrow 6b and reduce water accumulation within the interstitial space 20 between the inner casing 18 and the outer wall 16.

As used herein, the interstitial space 20 in between the inner casing 18 and the outer wall 16 is referred to herein as the "dry well." The dry well prevents water and debris from entering the internal cavity 22, while still allowing sufficient air flow for cooling the electronics equipment therein. When ingress liquids (e.g., rain, snowmelt, etc.) or debris enter through the venting holes 34a, 34b or otherwise around the lid 12, the rain guard 42 blocks access to the internal cavity 22, and forces the ingress liquids downward. Fluids exit through the openings 30a and 30b in the outer wall 16.

In an example, a sump pump may also be provided in the interstitial space 20 and/or within the interior equipment cavity 22 (e.g., mounted to the backplane 15 and/or the inner casing 18 itself) to remove water that may accumulate therein.

In an example, a grate 43a and 43b can be provided for separating a lower portion of the interstitial space 20 from an upper portion of the interstitial space 20. At least one of the lower portion and the upper portion of the interstitial space 20 can be filled with washed stone or other media 3. The interstitial space 20 can be partially filled with soil, rock, or other media 3 to reduce or prevent debris from entering and to provide a media through which water and air can pass.

In the event of surrounding soil saturation and/or non-desirable fluids entering the interior equipment cavity 22, the internal compartment can include a sump pump 21 that activates to remove standing water above a nominal height. The sump pump 21 egresses water past a given height in the equipment cavity 22 (e.g., through openings 31a and 31b) and through openings 30a and 30b in the outer wall 16 into an adjacent dry well or onto the pavement or concrete surrounding the electronics equipment structure 10.

Figure 5:
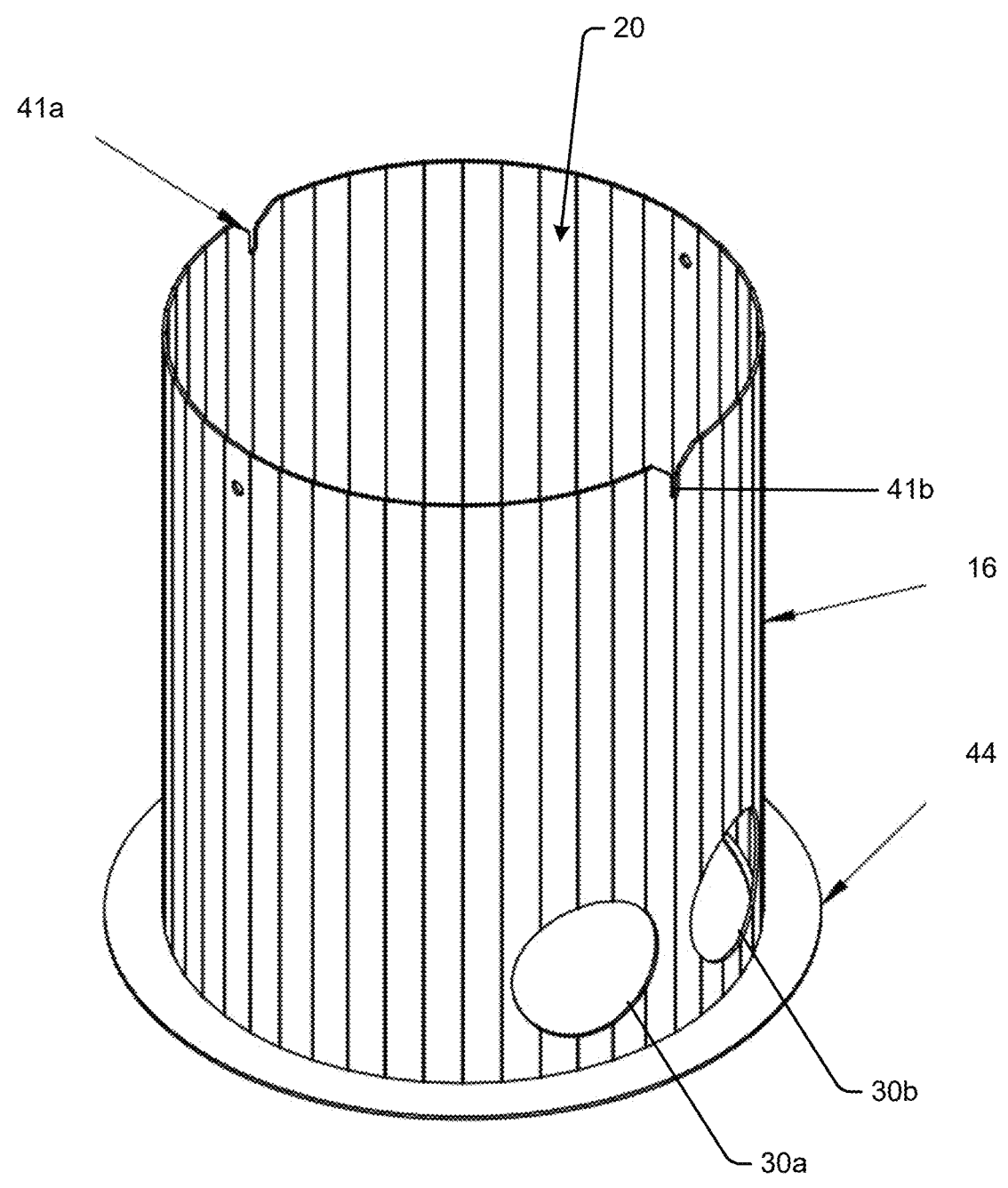
FIGS. 5 and 6 are isometric views of an outer wall of the example telecommunication equipment structure.
Figure 6:
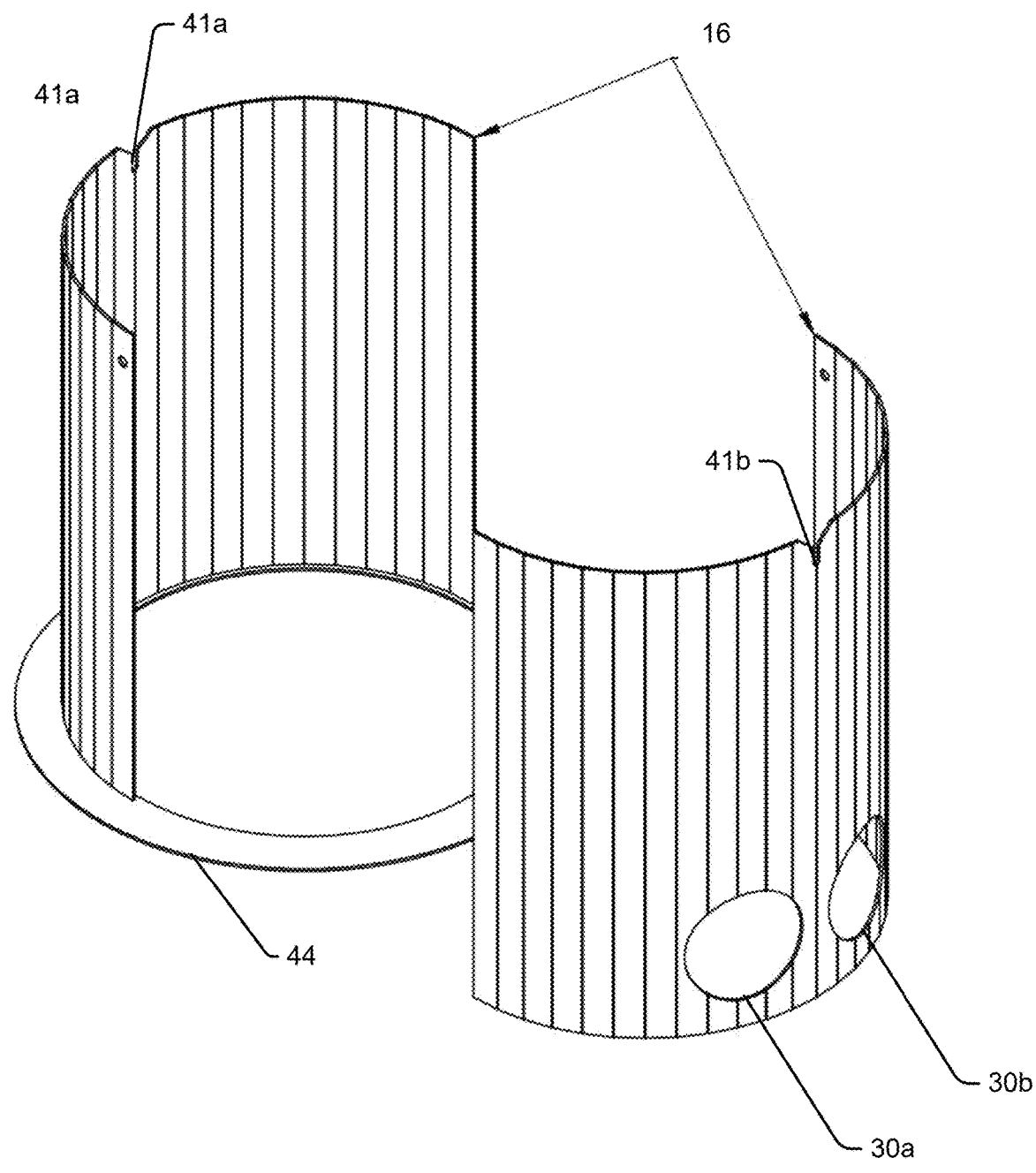
Figure 8:
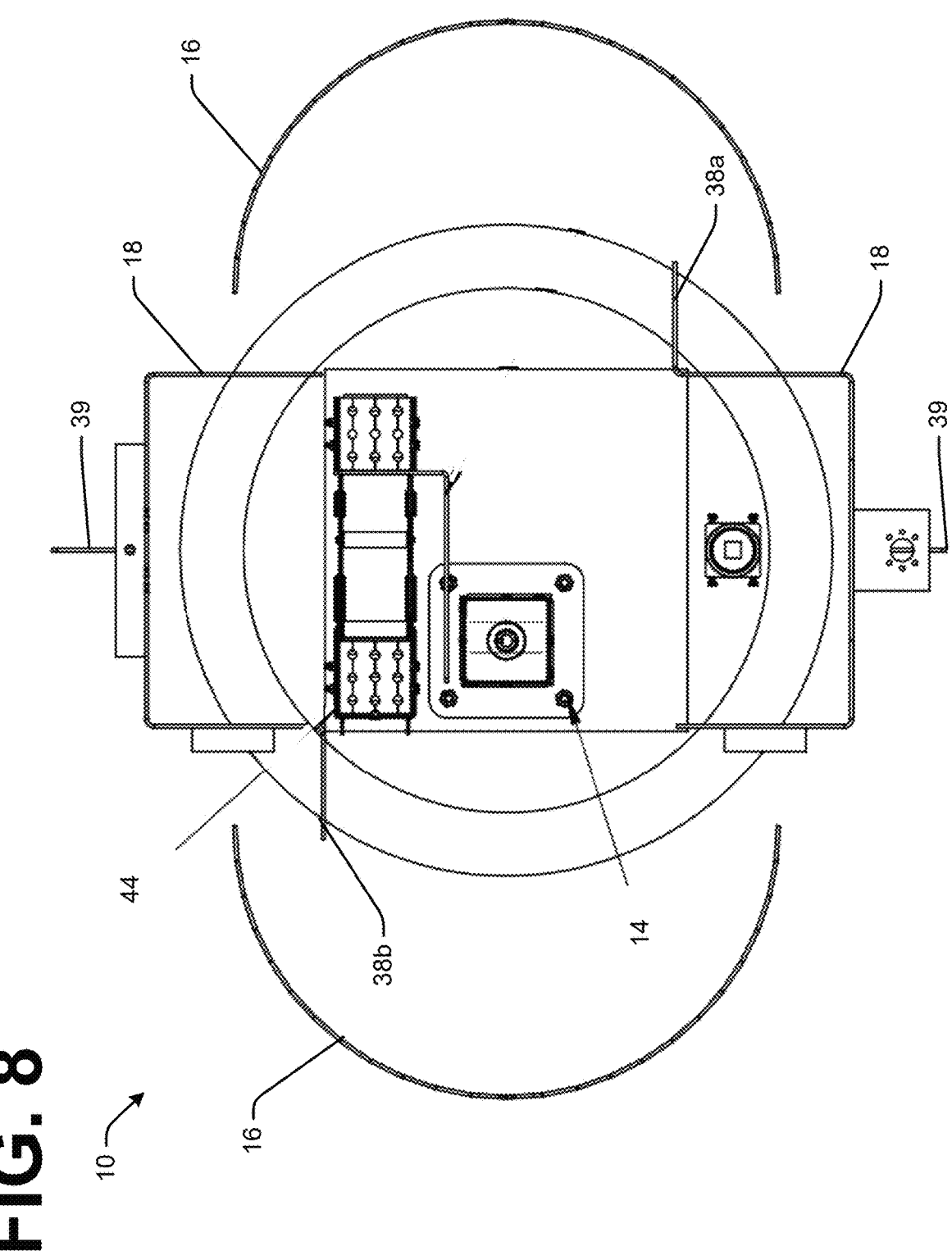
FIG. 8 is a partially exploded top view of the outer wall and inner casing of the example telecommunication equipment structure.
Figure 9:
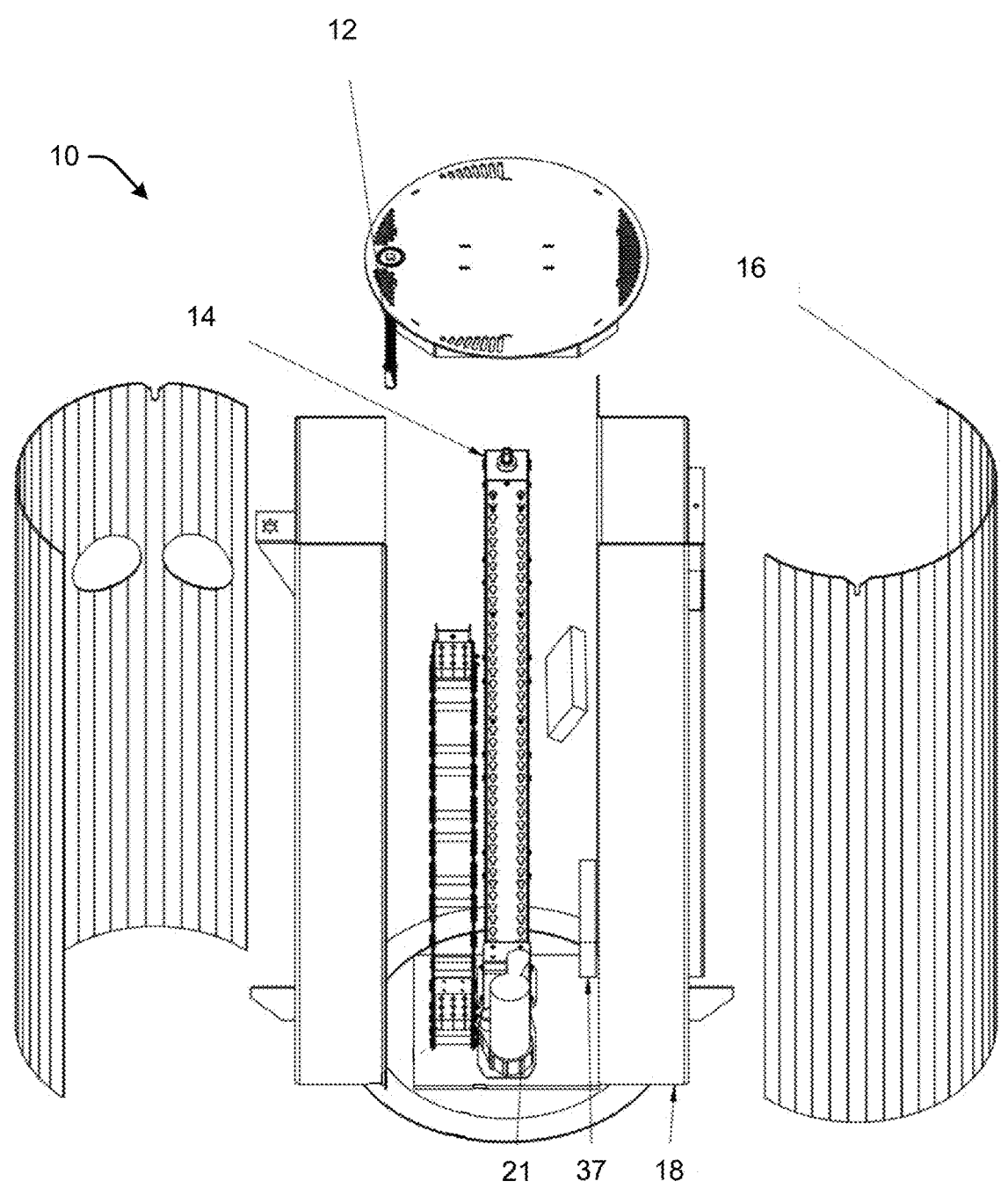
FIG. 9 is a partially exploded isometric view of the example telecommunication equipment structure.
Figure 10:
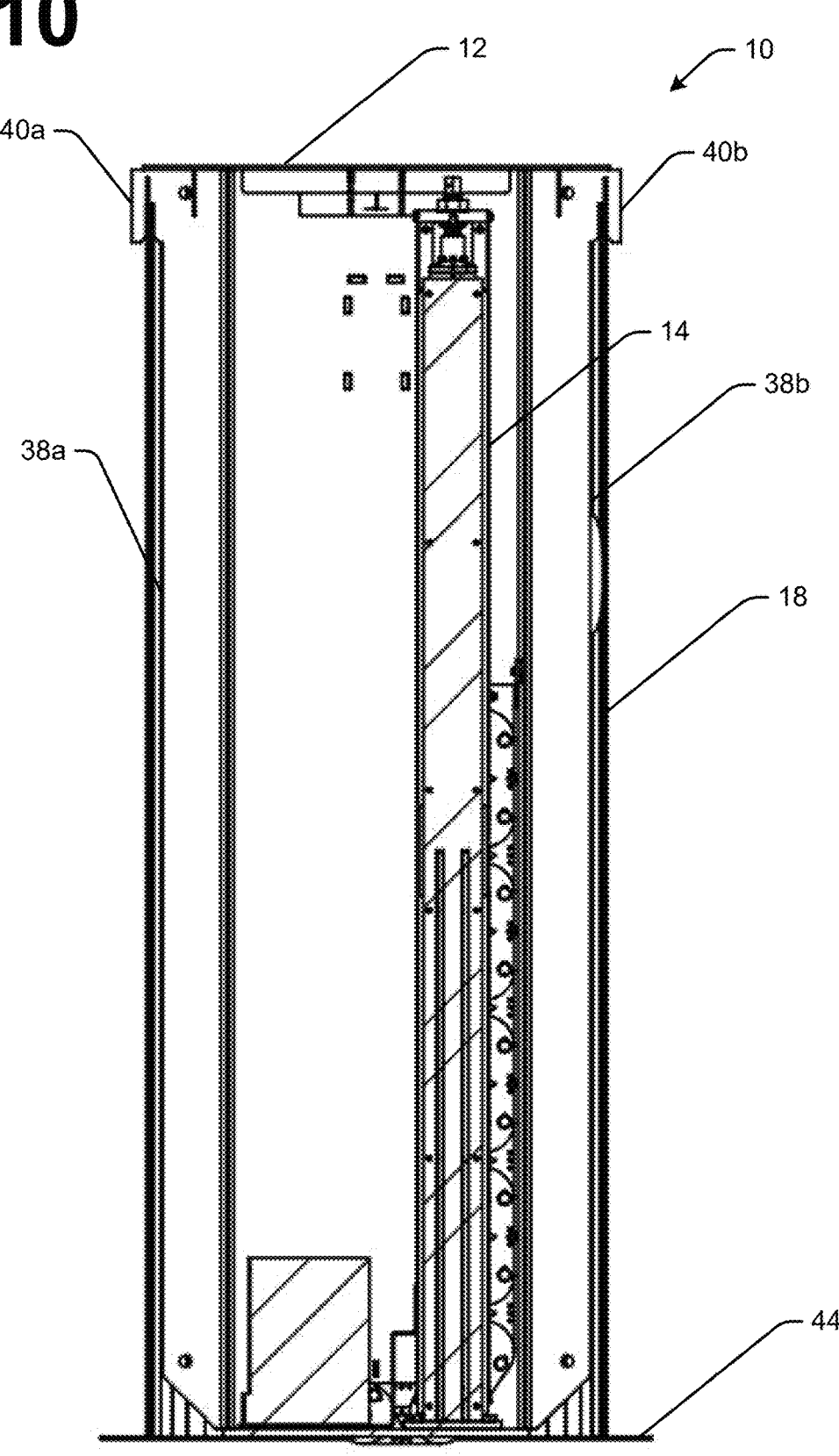
FIG. 10 is a cross sectional view of the example telecommunication equipment structure.
Figure 11:
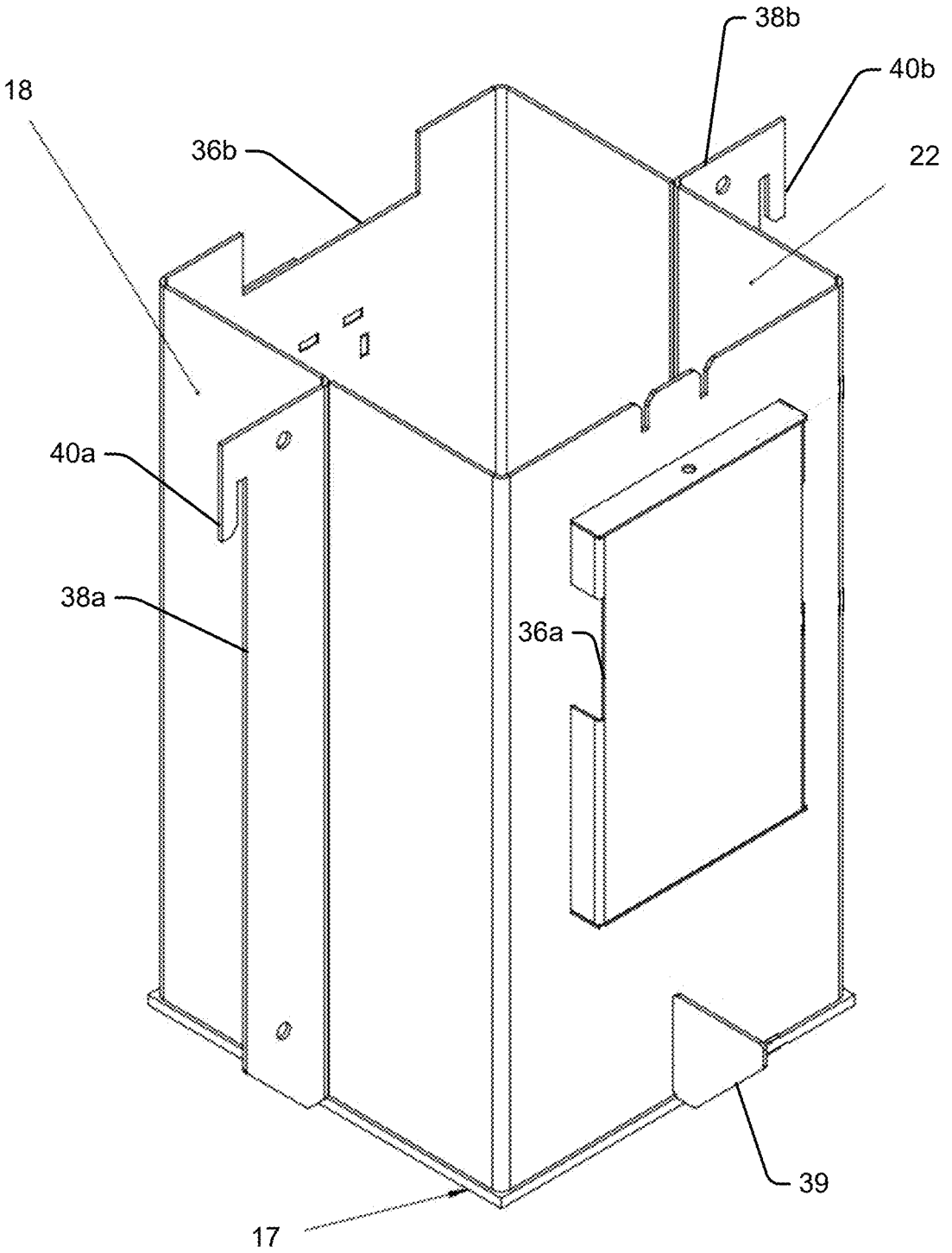
FIGS. 11-12 are isometric views of the inner casing of the example telecommunication equipment structure.
Figure 12:
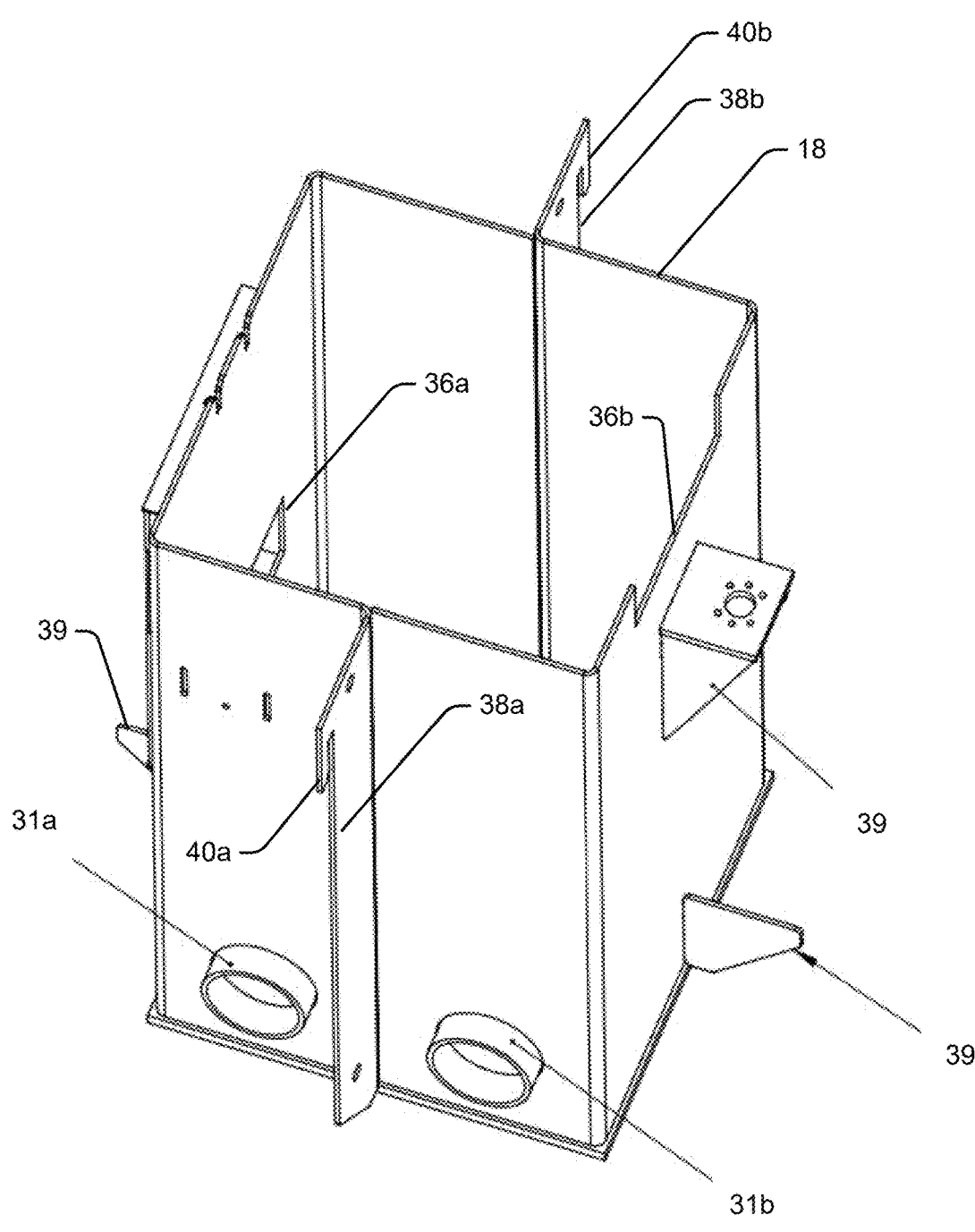

FIGS. 5 and 6 are isometric views of an outer wall 16 of the example telecommunication equipment structure 10. FIG. 7 is a partially exploded isometric view of the outer wall 16 and inner casing 18 of the example telecommunication equipment structure 10. FIG. 8 is a partially exploded top view of the outer wall 16 and inner casing 18 of the example telecommunication equipment structure 10. FIG. 9 is a partially exploded isometric view of the example telecommunication equipment structure 10. FIG. 10 is a cross sectional view of the example telecommunication equipment structure 10. FIGS. 11-12 are isometric views of the inner casing 18 of the example telecommunication equipment structure 10.

In an example, the outer wall 16 has a bearing ring 44 attached to a bottom edge of the outer wall 16. This bearing ring 44 helps to provide support for the outer wall, e.g., during installation so that it does not tip over. The outer wall 16 includes multiple pieces that are assembled together. The example of the outer wall 16 shown in the drawings includes two pieces that are assembled by connecting a first wall to a second wall. Likewise, the inner casing 18 may also include multiple pieces that are assembled together. The example of the inner casing 18 shown in the drawings includes two pieces that are assembled by connecting a first casing to a second casing. As already mentioned above, the inner casing 18 includes wall sections 38a and 38b that connect the inner casing 18 to the outer wall 16 (e.g., via tabs 40a and 40b that connect to slots 41a and 41b in the outer wall 16) and form separate chambers within the interstitial space 20 therebetween.

The inner casing 18 can be constructed as a cartridge or a unit that is completely replaceable and/or modular, and mounted via hooks or tabs 40a and 40b to the outer wall 16. The wall sections 38a and 38b and/or additional "fins" or positioning tabs 39 may be welded or otherwise attached to the inner casing 18 and/or outer wall 16 to restrict movement of the inner casing 18 relative to the outer wall once installed therein.

In an example, multiple inlet ports may be provided for wire and/or conduit, e.g., at a specified depth. These ports can be sealed after installation of the wires and/or conduit. The cable management includes a wire routing track that utilizes a nylon bulkhead and cut flat sheet components. There are multiple individual nylon blocks that squeeze around the conduit.

In an example, the inner casing 18 may include a bottom plate (e.g., welded thereto) to prevent and mitigate ingress from non-desirable material and liquid. In an example, the drive column or riser 14 can be mounted to the bottom plate (e.g., via nuts and bolts or welding). The inner casing 18 (including the bottom plate 17) may be provided with additional cutouts for slots 19 and corresponding tabbed portions for installing equipment, fans, etc. guide fins, and the lid ball screw mount 50 (see FIGS. 18 and 19). Gasketing material can be provided surrounding the contact points of the lid 12 to create a seal.

Figure 13:
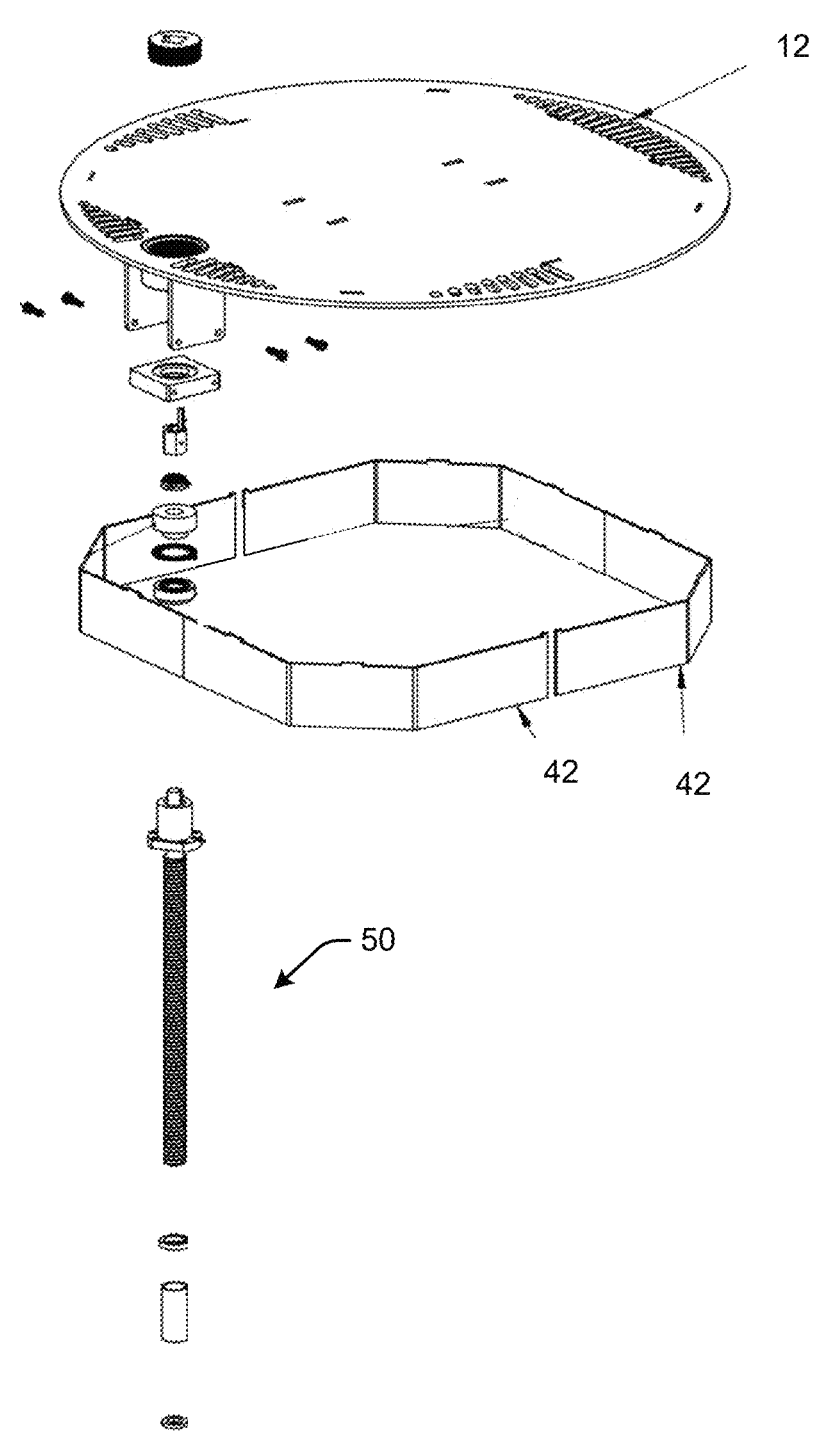
FIG. 13 is an exploded isometric view of a lid of the example telecommunication equipment structure.
Figure 18:
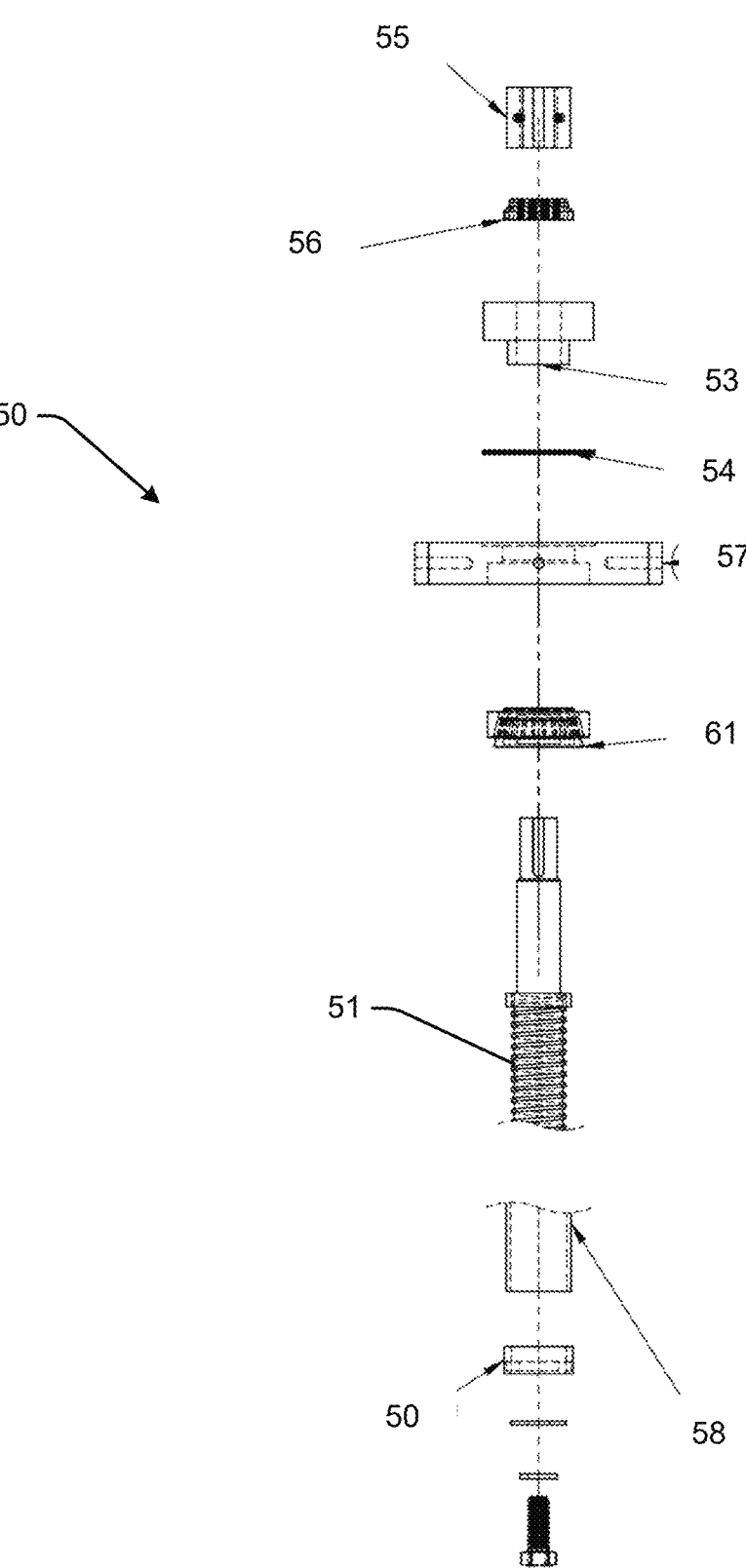
FIGS. 18 and 19 show a mounting assembly of the example telecommunication equipment structure.
Figure 19:
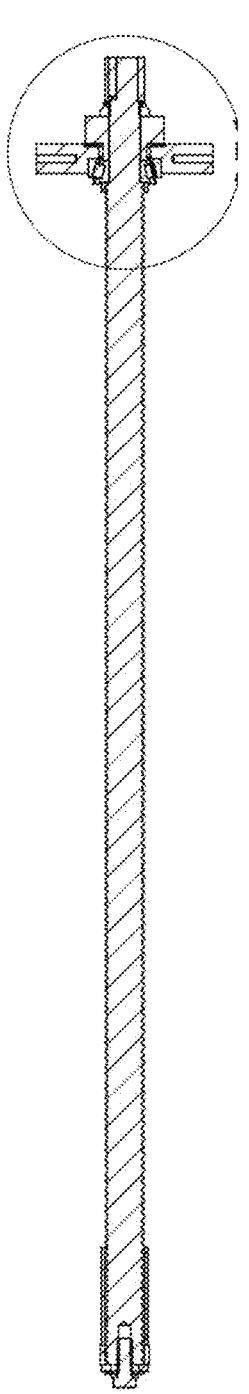
Figure 19:
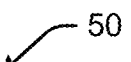

FIG. 13 is an exploded isometric view of a lid 12 of the example telecommunication equipment structure 10. An example of the vented lid 12 is manufactured with tread plate and reinforcements underneath. The lid 12 is removable through access to a ball screw structure 50 (FIGS. 18 and 19). The lid 12 operates via a swivel plate on the ball screw structure 50. This is mounted on the ball screw structure 50 with a tapered thrust bearing, needle bearing, custom flange nut, and a bearing locknut. A swivel plate, which is mounted to the lid 12 reinforcements, can rotate independently of the ball screw structure 50, allowing for vertical and constrained rotational movement. The reinforcements in the lid 12 also act as guides, so that when the lid 12 is at the end of its stroke downward, the reinforcements nestle into the inner casing 18.

In an example, the lid 12 is mounted to the riser column 14 to move with the riser column 14 between the lowered position and the raised position. The lid 12 covers both the interstitial space 20 (at least partially) and the equipment cavity 22 (fully). The lid 12 has ventilation openings 34a and 34b formed therein. The lid 12 can rest on or at least partly contact the inner casing 18 above an upper rim of the outer wall 16 to form a gutter between the upper rim of the outer wall 16 and the lid 12.

Figure 14:
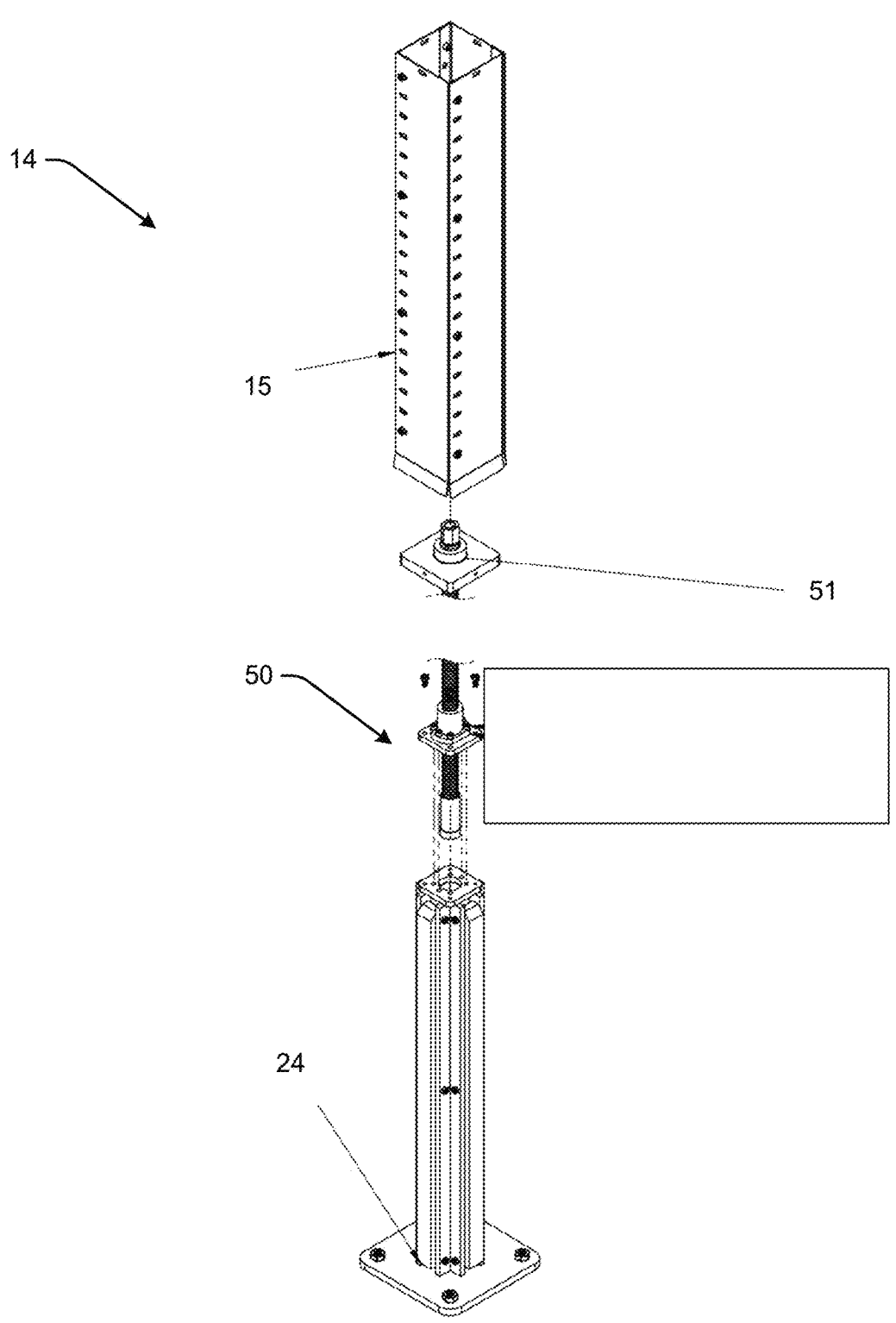
FIG. 14 is an exploded isometric view of a riser column of the example telecommunication equipment structure.
Figure 15:
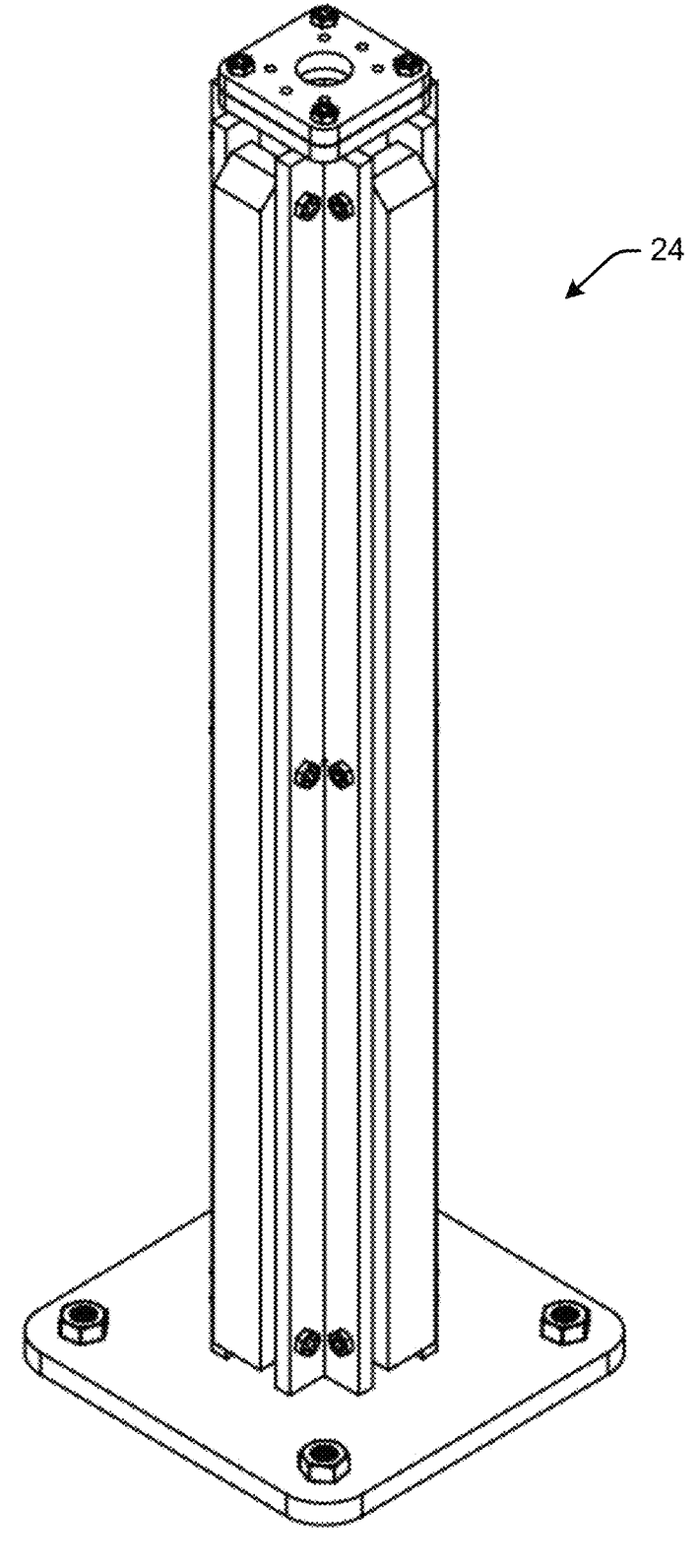
FIG. 15 is an isometric view of a stationary base structure of the example telecommunication equipment structure.
Figure 16:
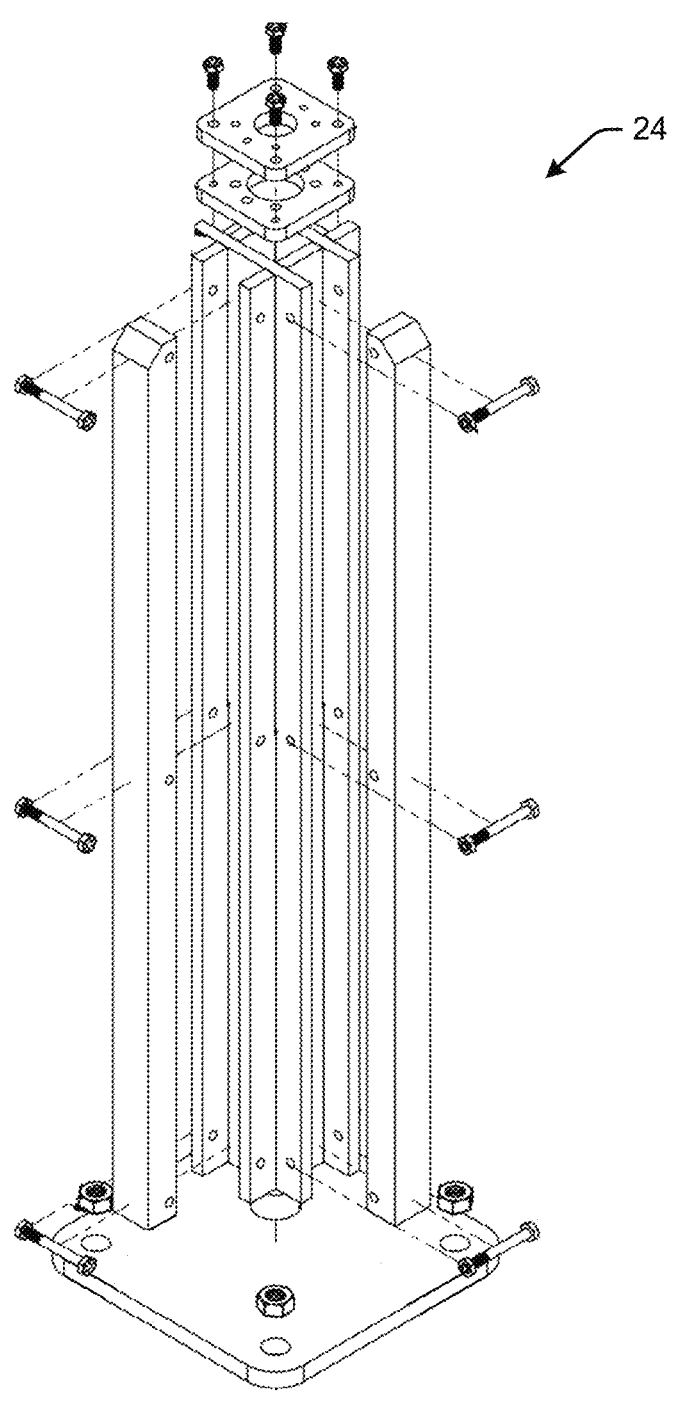
FIGS. 16 and 17 are partially exploded isometric views of the stationary base structure of the example telecommunication equipment structure.
Figure 17:
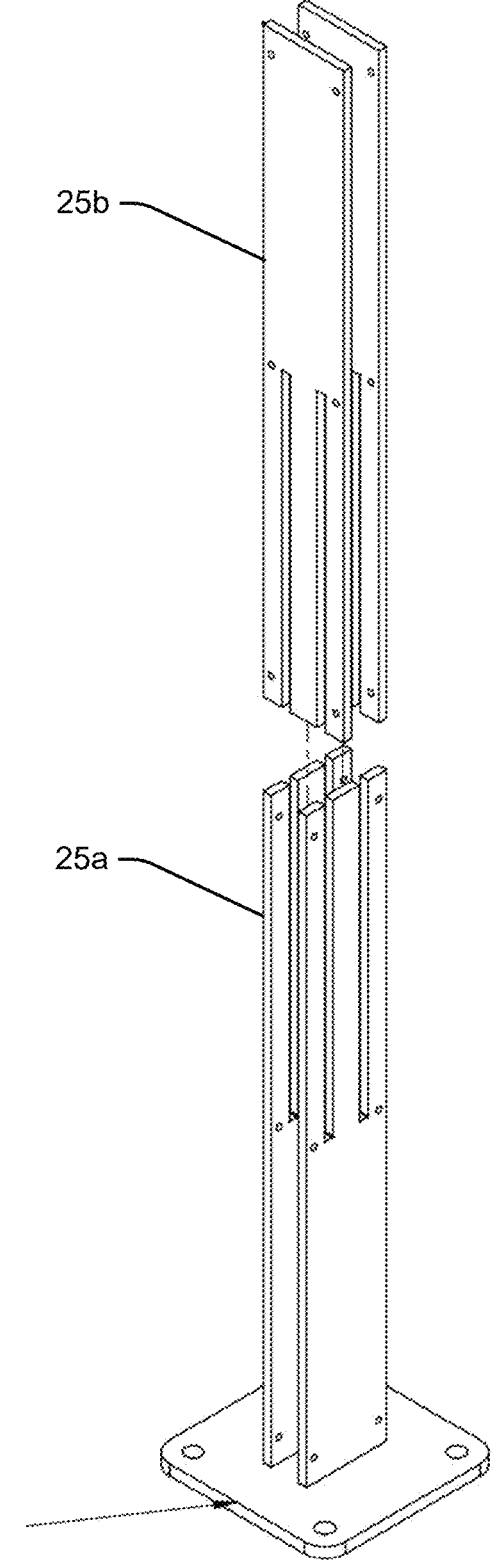

FIG. 14 is an exploded isometric view of a riser column 14 of the example telecommunication equipment structure 10. FIG. 15 is an isometric view of a stationary base structure 24 of the example telecommunication equipment structure 10. FIGS. 16 and 17 are partially exploded isometric views of the stationary base structure 24 of the example telecommunication equipment structure 10.

The drive column or movable riser 14 includes stationary base structure 24 including a structural slotted structure 25a and 25b shown in the drawings, a ball screw 51 with mounting provisions, and a shell or backplane 15 for equipment mounting thereto. The ball screw 51 operates via ball bearings internal to the nut, which is mounted to the slotted weldment. The slotted weldment (W-Puzzle in the assembly) is interlaced and varies in depth and size. The plates mount together to create a centered square where the ball screw assembly 50 resides. The weldment is mounted to a base plate with slot and tabs and is then welded. Mounted to the plates are polymer guides. These guides constrain the sheet metal shell and prevent rotation while still providing a smooth and quiet ride while traveling vertically. There is a polymer rod at the bottom of the channel, created by the weldment, which constrains the stroke of the ball screw 51. Attached to the top of the weldment is a tappet plate. This plate is used to mount the ball screw 51 through an opening formed therein.

FIGS. 18 and 19 show a mounting assembly 50 for the ball screw 51 of the example telecommunication equipment structure 10. The assembly 50 is provided to mount to the slotted weldment top plate via a tapped adapter plate and a ball nut. In an example, the assembly 50 includes a bolt with a split lock, two structural washers, and a stainless steel sleeve 58 and tape insulator 60. These components thread into the bottom of the ball screw 51 and are held in place by a load rated nut. Vertical motion is achieved by a ball nut that is mounted on the ball screw 51 with an adapter plate. The top components include a tapered thrust bearing 61, a custom mounting plate 57, a needle bearing 54, a custom flange nut 53, a bearing lock nut 56, and a hex key assembly 55 that is used with a socket. The mounting plate 57 rotates independently of the ball screw due to the thrust and needle bearing 54. This is then pressed down on by the flange nut and is all retained by the bearing locknut 56. The shell is mounted to the ball screw via a threaded mount plate 57 and bolts. The sheet metal shell uses variable mounting options like keyway slots and rivnuts for equipment mounting. The end of the shell is flared outward to slide onto the polymer guides easier.

Figure 20:
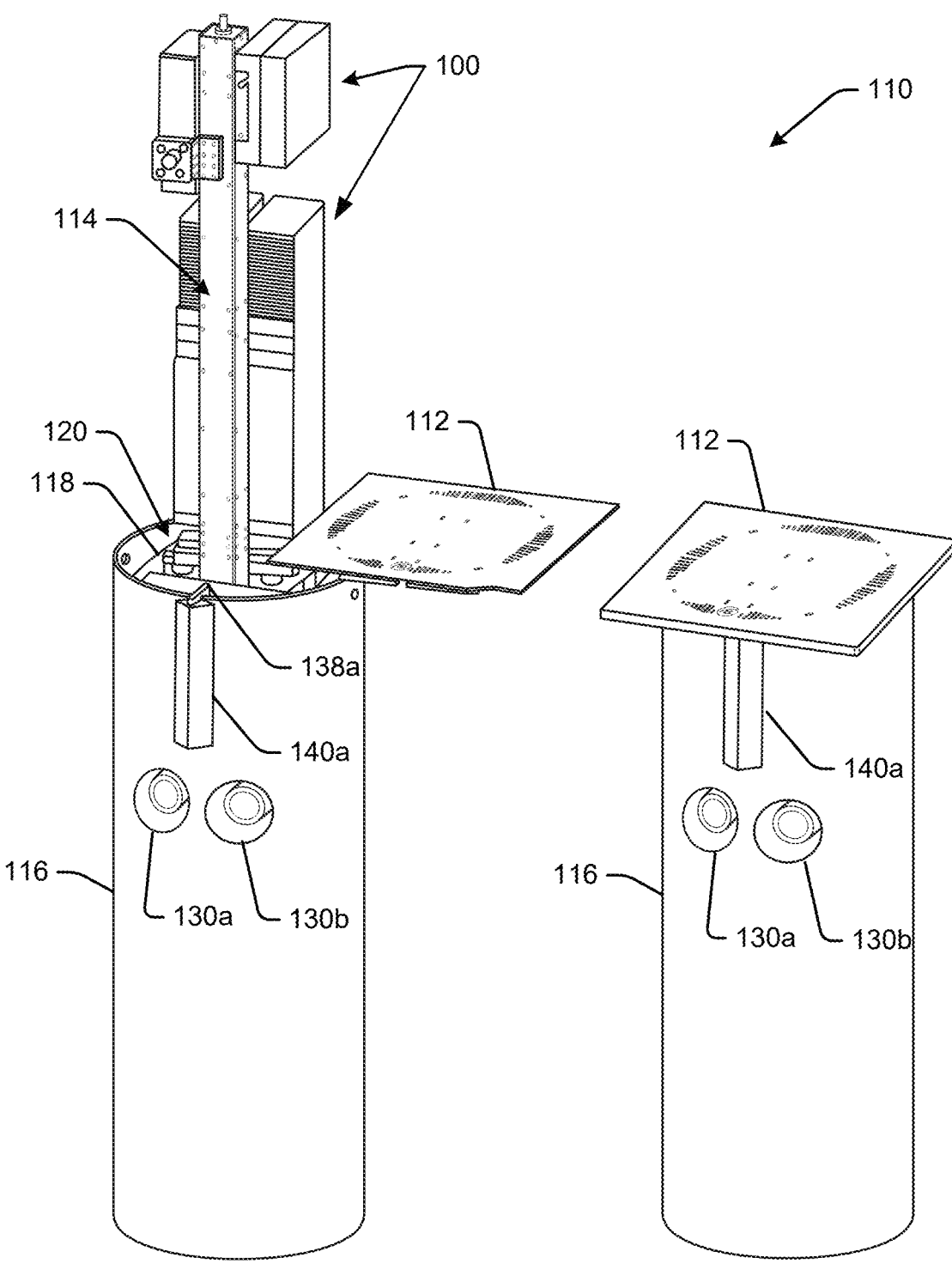
FIG. 20 are isometric views of another example telecommunication equipment structure shown in both a raised position and a lowered position.
Figure 21:
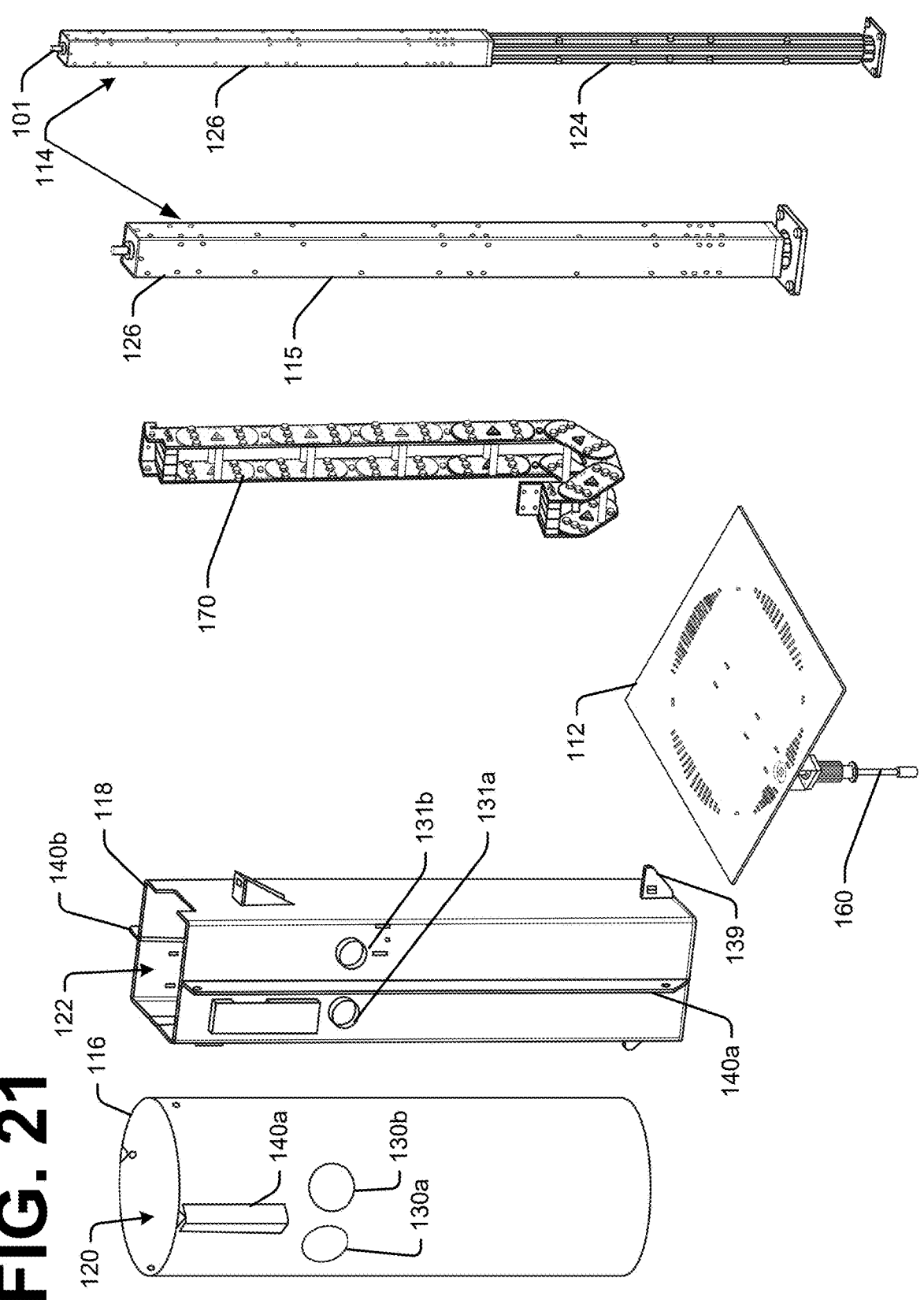
FIG. 21 shows example components of the telecommunication equipment structure shown in FIG. 20.

FIGS. 20-29 show another example of a telecommunication equipment structure 110. It is noted that 100-series reference numbers are used herein to refer to like components, and that said components may not be described again with reference to these figures. FIG. 20 are isometric views of the example telecommunication equipment structure 110 shown in both a raised position and a lowered position. FIG. 21 shows example components of the telecommunication equipment structure 110 shown in FIG. 20.

As already described above, the example telecommunication equipment structure 110 also includes an outer wall 116 for deployment at least partially below the surface of the ground with the lid 112 substantially flush with the surface of the ground, at least partially above the surface of the ground, and/or with the outer wall 116 also at least partially above the surface of the ground.

The example telecommunication equipment structure 110 includes an inner casing 118 provided within the outer wall 116. An interstitial space 120 (or spaces) is formed between the inner casing 118 and the outer wall 116. The interstitial space 120 can be configured to be at least partly filled with washed stone or other suitable media that provides for the passage of water or drainage and/or airflow therethrough.

The inner casing 118 provides a protective barrier for an equipment cavity 122 formed within the inner casing 118. The lid 112 covers at least the equipment cavity 122 for telecommunication equipment mounted therein (e.g., to the riser column 114). The riser column 114 can be mounted in the equipment cavity 122 formed within the inner casing 118. In an example, the riser column 114 has a backplane 115 or other mounting structure to mount electronics equipment 100 thereto. The backplane 115 can have a mounting surface (e.g., a pegboard like and/or bracket structure) to enable easy changes to the equipment mounted thereto.

In an example, the riser column 114 has a stationary base structure 124 and a movable riser structure 126. The movable riser structure 126 moves relative to the stationary base structure 124 between the first lowered position and the second raised position. The riser column 114 is configured to move between a lowered or closed position in the equipment cavity 122 formed within the inner casing 118, and raised or open position. The partially or fully raised position provides for access (e.g., by an installer or technician) to the telecommunication equipment 100 mounted to the backplane 115 of the riser column 114.

In an example, the inner casing 118 provides for a removable and interchangeable cartridge assembly or column 114. The column or movable riser structure 114 (or a part thereof, such as components 124 and/or 126) can be interchanged with another column or part thereof (e.g., that already has upgraded or replacement electronics equipment mounted thereto). This aids in quick and easy change out of different equipment, and for servicing the equipment mounted on the column (e.g., on site or away) from above the ground level without the user having to bend or lay down to reach down into the telecommunication equipment structure 110.

Also shown in FIG. 21 (and shown operations in FIGS. 25 and 26) is a cable management system 160. The example cable management system 160 is a track structure (e.g., a linked chain) which accepts cables to be mounted thereto and provides a guide for the cables to move without tangling or pulling as the column 114 is raised and lowered.

The lid 112 of telecommunication equipment structure 110 may be pivotally mounted (e.g., by pivot pin 160) to the outer wall 116. As such, the lid 112 can be rotated or swung out of the way (e.g., from about 180 degrees as illustrated in FIG. 20 to about 360 degrees for full rotation). Rotating the lid 112 provides the user access to the top of the riser column 114.

In an example, the lid 112 is partially raised, and then swings around to open. The lid 112 may then swing back around to cover the opening, and be lowered down into position to provide a flush and secure fit with the top perimeter of the outer wall 116.

In an example, the outer wall 116 is configured with receiving pockets that allow for multiple configurations of cartridges to be assembled therein. The outerwall 116 contains a void that allows installers to have excavation protection during installation.

In an example, the inner casing 118 is configured as a cartridge that allows for a sealed square cabinet to house the electronic equipment 100. These cartridges are interchangeable within the outer wall 116, making this a modular solution.

In an example, the lid 112 swivels and includes openings for airflow. A single point of access via the lid 112 provides access for secure systems and minimizes the number of connections necessary.

In an example, a cable management system 170 is configured as a chain or linkage that provides for coax, power cables, or other wiring to be organized, while allowing the riser column 114 to travel up and down with the electronics equipment 100, while protecting the cables from PIM intermodulation distortion and/or other damage.

In an example, the riser column 114 utilizes a fully mechanical system so that a constant power source is not needed to access the equipment. The riser column can be operated fully manually and/or with the aid of a cordless drill or other drive mechanism. The riser column 114 is configured for providing maximum equipment space by being offset (see, e.g., FIG. 28) when installed within the inner casing 118.

Figure 22:
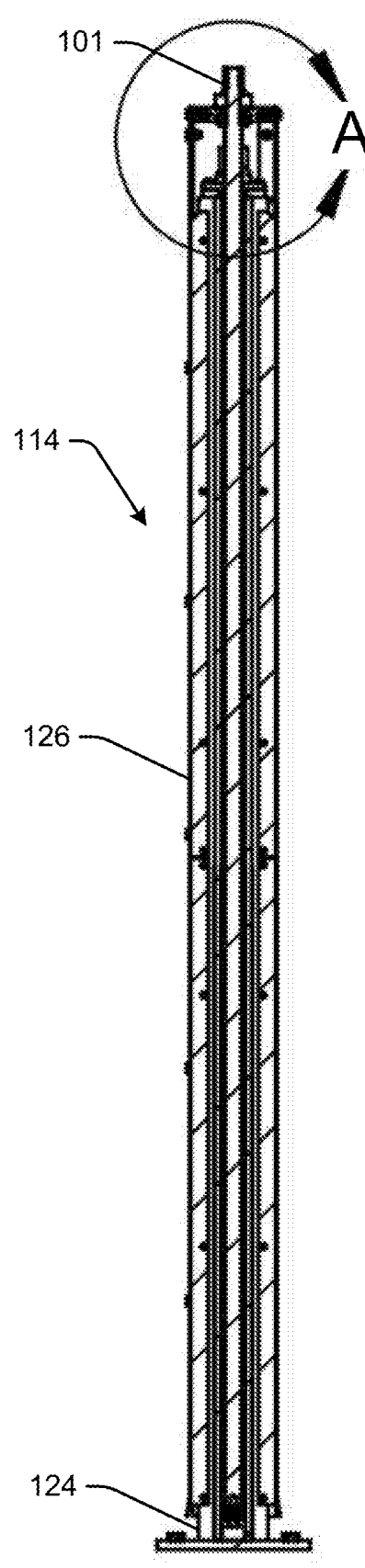
FIG. 22 is a side cross-sectional view of the riser column with stationary base structure and movable riser structure shown in FIG. 21.
Figure 23:
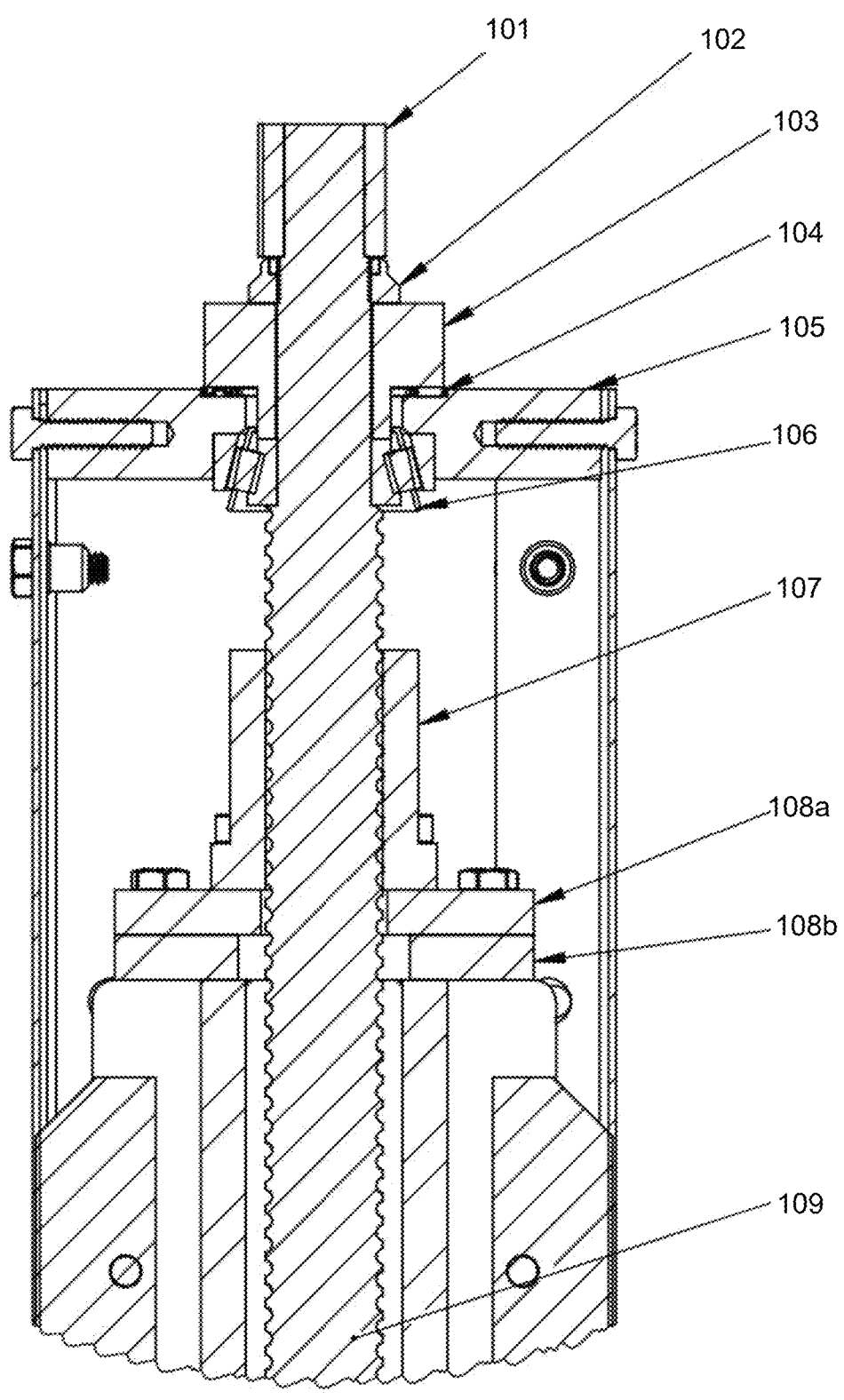
FIG. 23 is a detailed view from section A shown in FIG. 22.

FIG. 22 is a side cross-sectional view of the riser column 114 with stationary base structure 124 and movable riser structure 126 shown in FIG. 21. FIG. 23 is a detailed view from section A shown in FIG. 22 showing an example drive mechanism. An example, the drive mechanism includes a hex drive 101 (e.g., nut or other crank handle such as a handle), a spanner lock nut 102, a flange nut 103, a needle thrust bearing 104, a ball screw mount plate 105, a tapered thrust bearing 106, a ball nut 107, a ball nut mounting plate 108*a*, a center column connection plate 108*b* and a ball screw 109 or worm gear.

The hex drive 101 or other crank (e.g., a handle) is provided on top of the riser column 114 and can be operated by manually turning or turning with a cordless drill (e.g., having a hex head) or other motor, to rotate the ball screw 109 in a first direction (e.g., counter-clockwise) inside the riser column 114 to move the riser structure 126 in an upward or downward direction on the stationary base structure 24. Rotating the ball screw 109 (e.g., via hex drive 101) in the opposite direction (e.g., clockwise) drives the movable riser structure 126 in a downward direction on the stationary base structure 124.

The ball screw 109 is held to the plate by a spanner lock nut 102. The flange nut 103 and needle thrust bearing 104 allow the ball screw 109 to rotate independently from the shell. The ball screw mount plate 105 can be installed with the tapered thrust bearing 106 on the bottom to resist axial and torsional load. The ball nut 107 locks the ball screw 109 with ball bearings. The ball screw 109 is driven by the hex drive 101.

Figure 24:
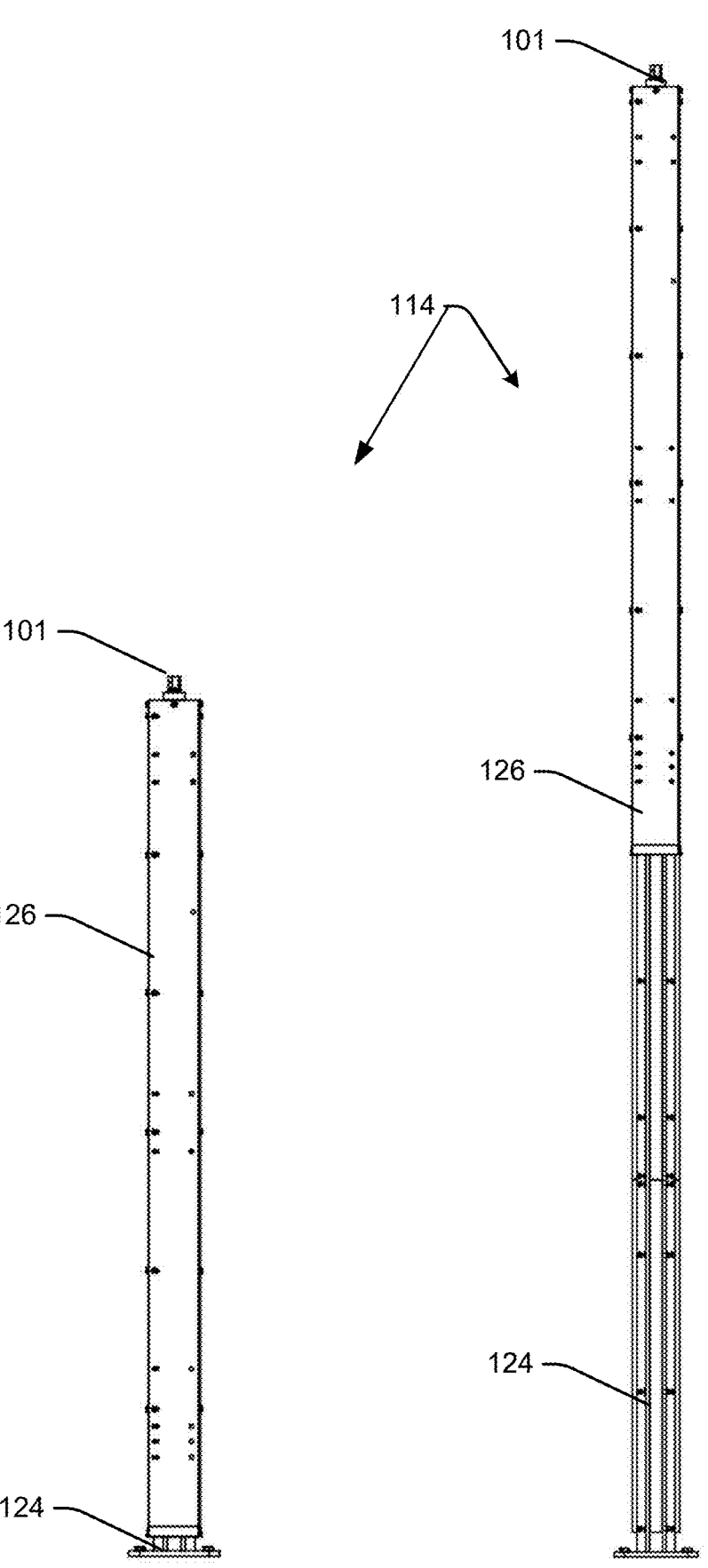
FIGS. 24-26 illustrate raising and lowering of the riser column with stationary base structure and movable riser structure.
Figure 25:
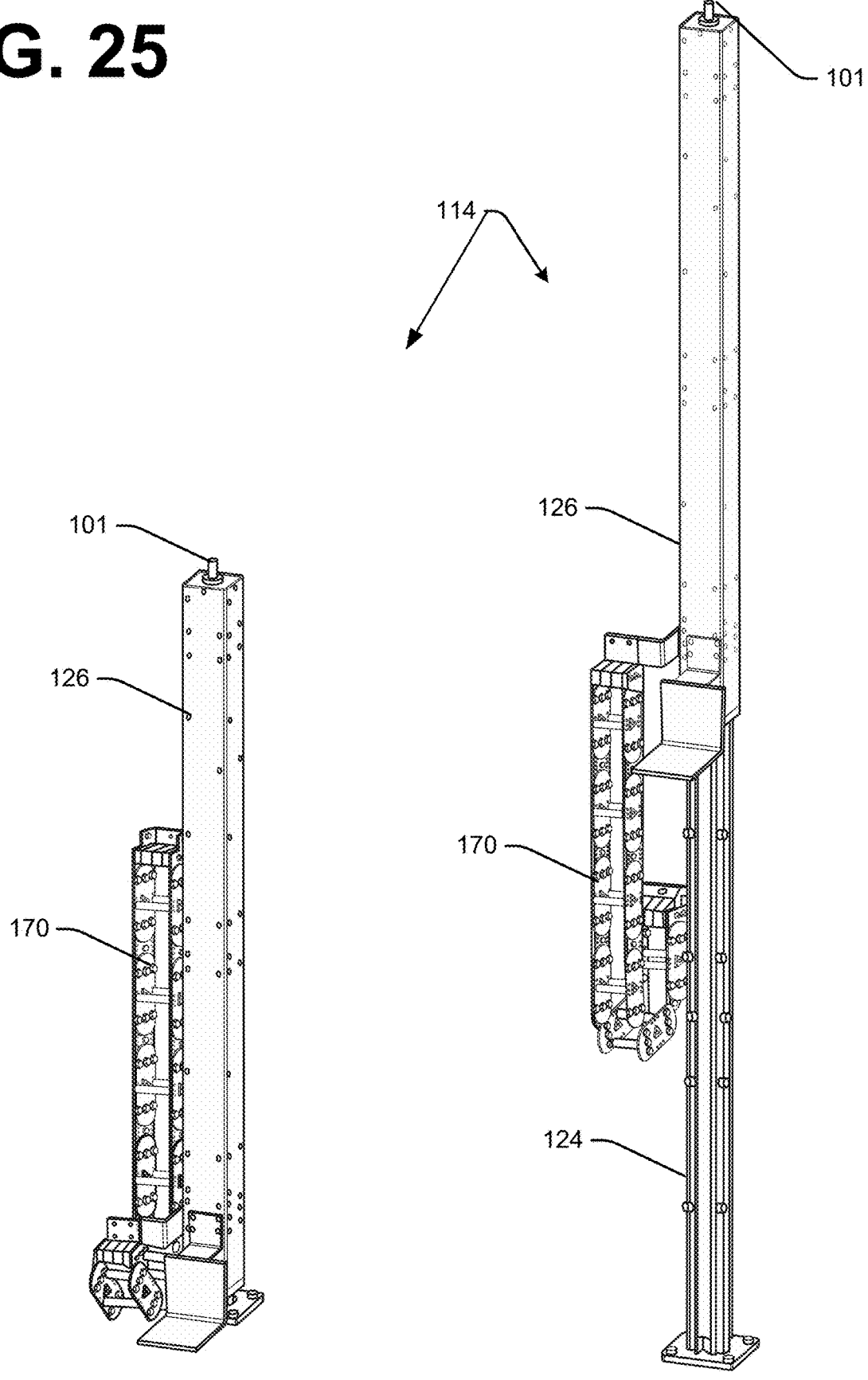
Figure 26:
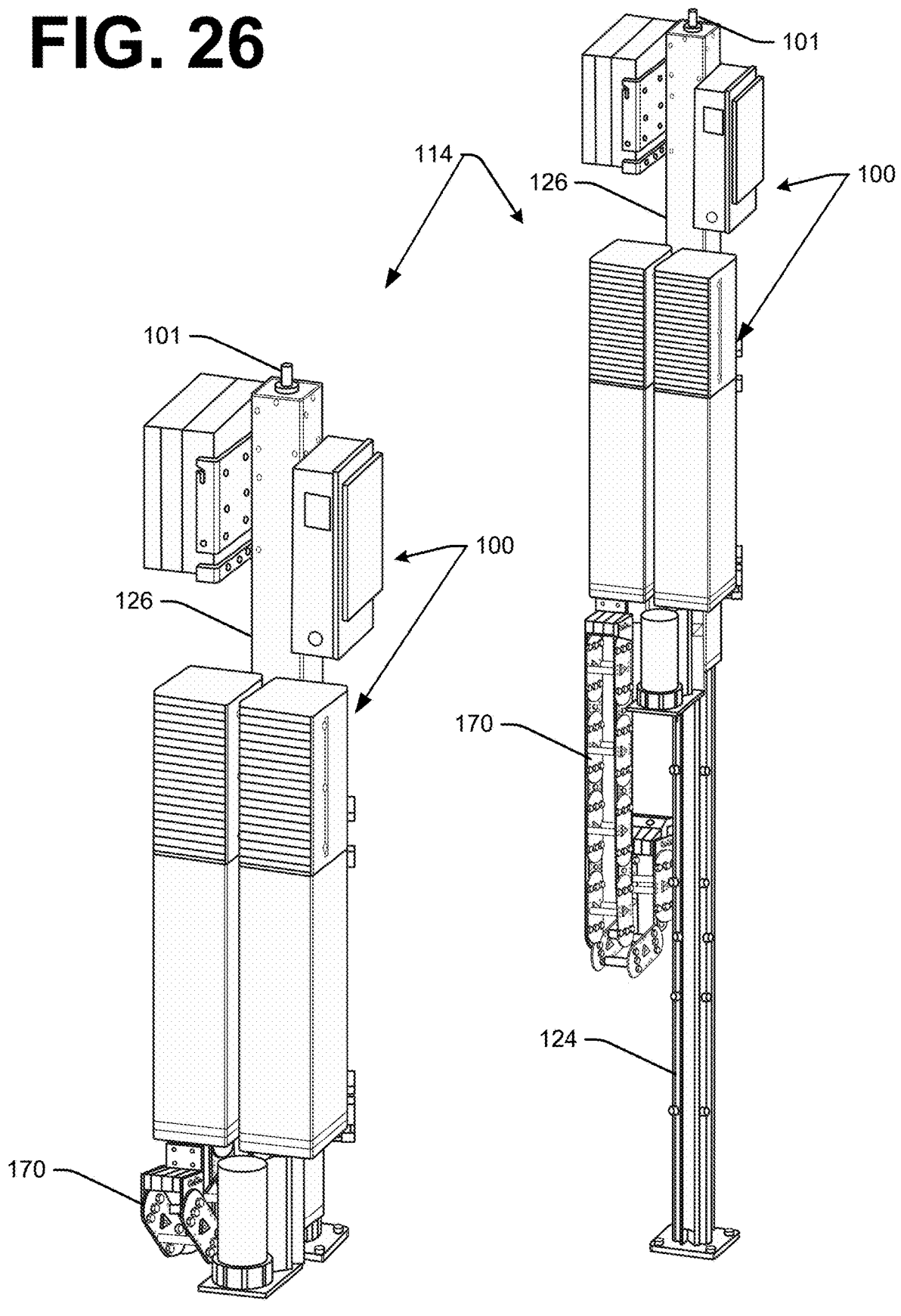

FIGS. 24-26 illustrate riser column 114 with stationary base structure 124 and movable riser structure 126. FIG. 24 shows the movable riser structure 126 as it may move relative to the stationary base structure 124. FIG. 25 shows the cable management system 170 moving with the movable riser structure 126 relative to the stationary base structure 124. FIG. 26 shows example electronic equipment 100 and the cable management system 170 as these may move with the movable riser structure 126 relative to the stationary base structure 124.

Figure 27:
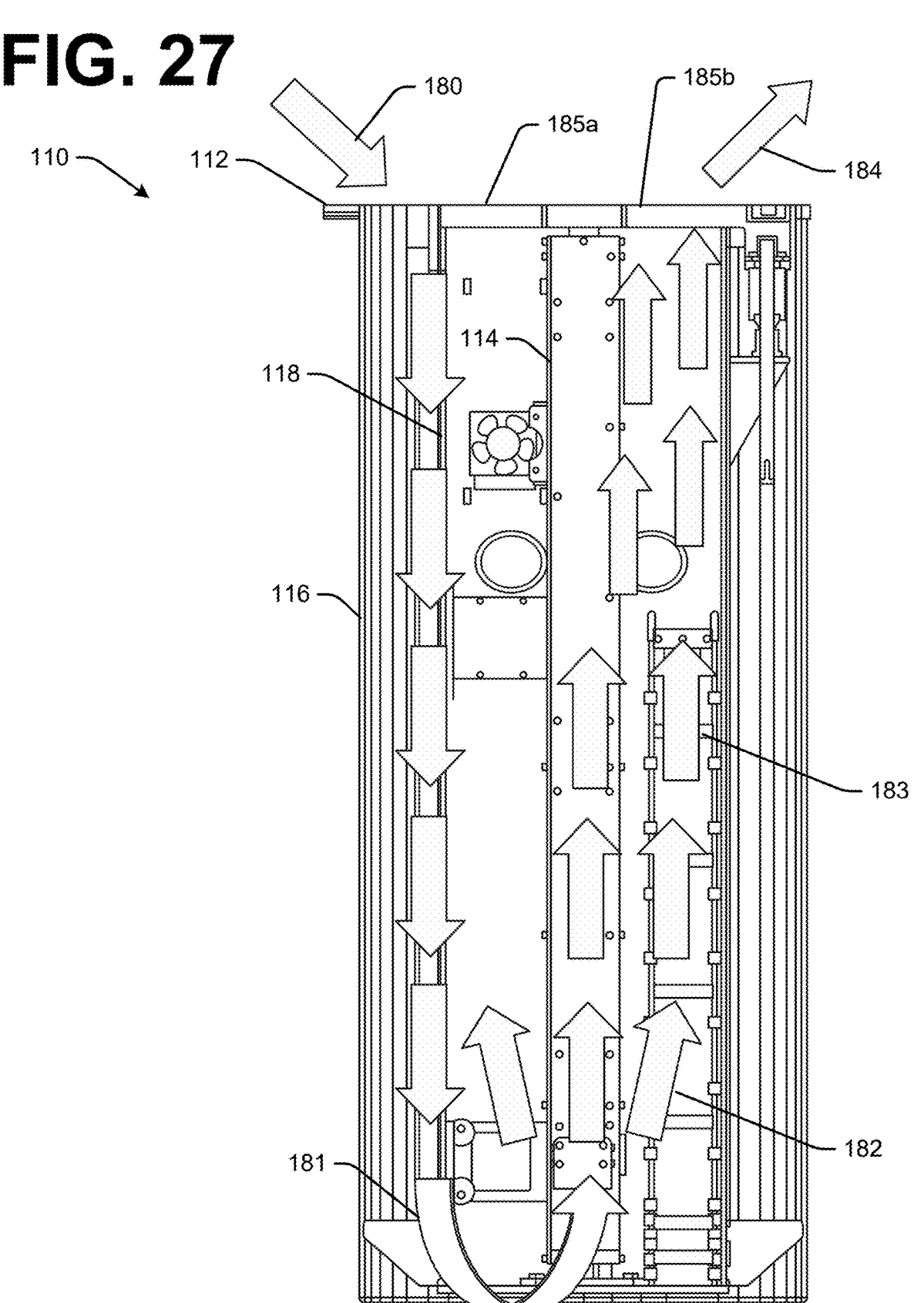
FIG. 27 illustrates thermal management for the telecommunication equipment structure.

FIG. 27 illustrates thermal management for the telecommunication equipment structure 110. In an example, thermal management includes airflow via an isolated exhaust and intake ventilation. This provides a thermal break between the intake and exhaust airflow.

In FIG. 27, airflow is illustrated by arrows. Arrow 180 represents cool intake air. The intake air is drawn into and pulled down between the outer wall and the inner casing 118 by one or more blower and/or suction fans. The cool intake air illustrated by arrow 181 then enters into the inner casing 118 at the bottom of the inner casing 118. As the airflow travels upward, it warms, as illustrated by arrows 182 and 183. The heated air is then exhausted as illustrated by arrow 184.

In an example, vent placement in the lid 112 allows fresh air to flow in through intake vents 185a on one side of the lid 112, and heated air to be exhausted or to flow out via fan assisted airflow, through exhaust vents 185b provided through the other side of the lid 112. In an example, air conditioning (AC) and/or heat pump systems may also be connected as desired.

Figure 28:
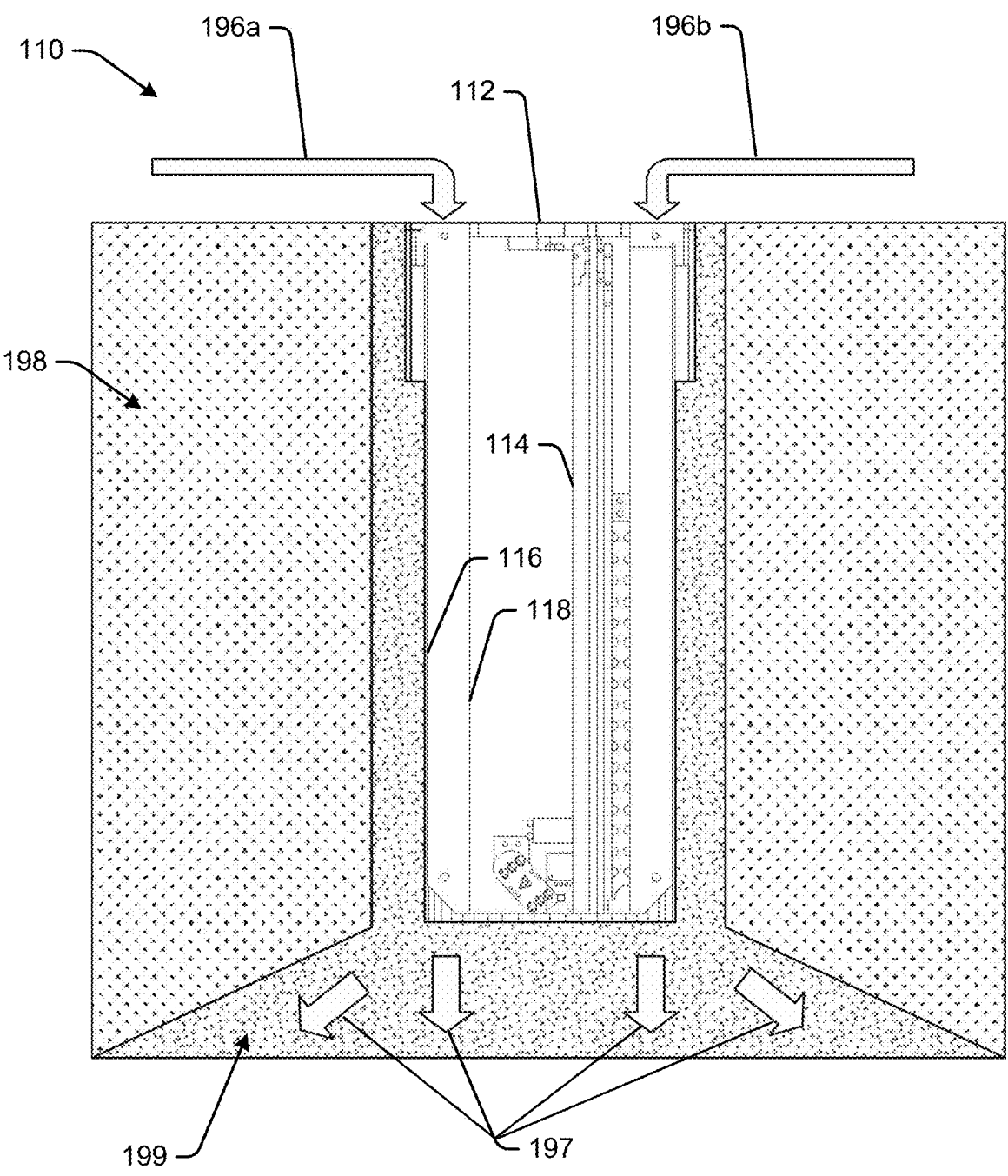
FIGS. 28-29 illustrate water management for the telecommunication equipment structure.
Figure 29:
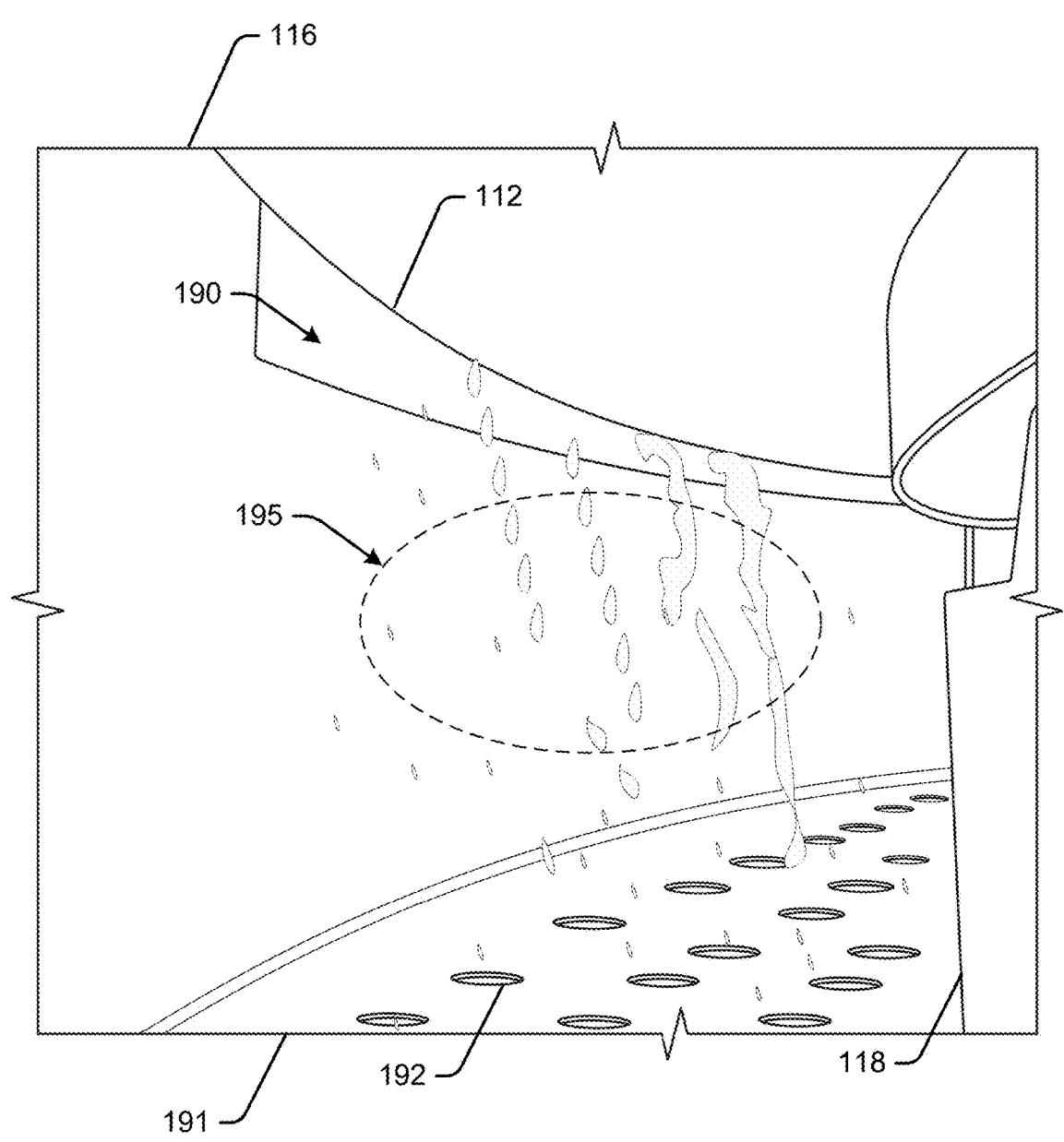

FIGS. 28-29 illustrate water management for the telecommunication equipment structure 110. In an example, water management includes water or drainage flow (e.g., rain water, runoff, etc.) via intake and discharge water flow paths that are isolated from the electronics equipment 100. In an example, water management is aided by soil permeation. That is, a dry well catches water between the outer wall 116 and the inner casing 118. A sump pump may also be installed to help mitigate water collection (e.g., by pumping it out of the dry well).

In FIG. 28, water flow is illustrated by arrows. Arrows 196a and 196b represent water inflow. See also the illustration in FIG. 29. This drip edge includes the lid 112 providing a vertical surface for water to collect on and then flow into the dry well formed between the outer wall 116 and the inner casing 118. That is, the water 195 flows into an opening 190 near the upper perimeter of the outer wall 116 under the lid 112, and flows down between the outer wall 116 and the inner casing 118. The lid design including a drip edge as shown in FIG. 29 prevents water return into the telecommunication equipment structure 110 once discharged. This also aids in leaving this space open for heat ventilation as discussed above with reference to airflow management.

In FIG. 29, a baffle or screen 191 having openings 192 is shown in this space between the outer wall 116 and the inner casing 118, as it may be provided to block debris from traveling too deep and so that it can be readily removed during maintenance and cleaning.

The water illustrated by arrows 196a and 196b flows to the bottom of the telecommunication equipment structure 110 where it drains out as illustrated by arrows 197. Permeable soil 198 and/or gravel or stone 199 may be provided so that the water drains away from the telecommunication equipment structure 110. Soil and/or stone can be selected based at least in part on the site and conditions so that all water is readily and quickly pushed through the soil profile.

It is noted that the examples shown and described are provided for purposes of illustration and are not intended to be limiting. Still other examples are also contemplated.

The invention claimed is:

1. A telecommunication equipment structure, comprising:
   an outer wall for deployment at least partially below the surface of the ground;
   an inner casing provided within the outer wall and forming an interstitial space between the inner casing and the outer wall, the inner casing providing a protective barrier for an equipment cavity formed within the inner casing;
   a lid to cover at least the equipment cavity for telecommunication equipment; and
   a riser column mounted in the equipment cavity formed within the inner casing, the riser column having a backplane to mount the telecommunication equipment thereto;
   wherein the riser column is configured to move between a first lowered position in the equipment cavity formed within the inner casing, and a second raised position for access to the telecommunication equipment mounted to the backplane.

2. The telecommunication equipment structure of claim 1, wherein the lid is mounted to move up into an open position, and down into a closed position, wherein the lid covers both the interstitial space and the equipment cavity, and wherein the lid has ventilation openings formed therein.

3. The telecommunication equipment structure of claim 2, wherein the lid rotates to open.

4. The telecommunication equipment structure of claim 2, further comprising a rain guard attached to a bottom surface of the lid, the rain guard fitting over an upper edge of the inner casing to reduce water entry into the equipment cavity, wherein the lid rests on the inner casing above an upper rim of the outer wall to form a gutter between the upper rim of the outer wall and the lid.

5. The telecommunication equipment structure of claim 1, wherein the riser column has a stationary base structure and a movable riser structure, the movable riser structure moving relative to the stationary base structure between the first lowered position and the second raised position.

6. The telecommunication equipment structure of claim 1, further comprising at least one ventilation fan mounted in the interstitial space between the inner casing and the outer wall, the at least one ventilation fan moving outside air into the equipment cavity to cool the telecommunication equipment therein.

7. The telecommunication equipment structure of claim 1, further comprising at least a first vent opening formed through the inner casing for moving outside air into the equipment cavity, and at least a second vent opening formed through the inner casing for expelling warmer air out of the equipment cavity, to cool the telecommunication equipment therein.

8. The telecommunication equipment structure of claim 1, wherein the interstitial space has split chambers including at least a first intake chamber and a second exhaust chamber for moving cooler air into the equipment cavity formed within the inner casing and warmer air out of the equipment cavity formed within the inner casing.

9. The telecommunication equipment structure of claim 1, wherein the outer wall has at least one drain opening formed therethrough to reduce water accumulation within the interstitial space between the inner casing and the outer wall.

10. The telecommunication equipment structure of claim 1, further comprising a grate separating a lower portion of the interstitial space from an upper portion of the interstitial space, wherein at least one of the lower portion and the upper portion of the interstitial space is configured to be filled with washed stone.

11. The telecommunication equipment structure of claim 1, wherein the outer wall is assembled by connecting a first wall to a second wall.

12. The telecommunication equipment structure of claim 1, wherein the inner casing is assembled by connecting a first casing to a second casing.

13. The telecommunication equipment structure of claim 1, wherein the inner casing connects to the outer wall.

14. The telecommunication equipment structure of claim 1, further comprising an outer bearing ring attached to a bottom edge of the outer wall.

15. The telecommunication equipment structure of claim 1, further comprising an air intake channel on the inner casing.

16. The telecommunication equipment structure of claim 1, wherein the inner casing forms a removable and interchangeable cartridge assembly.

17. A telecommunication equipment structure, comprising:

an outer wall for deployment at least partially below the surface of the ground;

an inner casing provided within the outer wall and forming an interstitial space between the inner casing and the outer wall, the inner casing providing a protective barrier for an equipment cavity formed within the inner casing;

a lid to cover at least the equipment cavity for telecommunication equipment; and a riser column having a stationary base structure and a movable riser structure, the movable riser structure moving relative to the stationary base structure between a first lowered position and a second raised position; and a backplane to mount the telecommunication equipment in the equipment cavity;

wherein the riser column is configured to move between a first lowered position in the equipment cavity formed within the inner casing, and a second raised position for access to the telecommunication equipment mounted to the backplane.

18. An electronics equipment structure, comprising:

an outer wall for deployment at least partially below the surface of the ground;

an inner casing provided within the outer wall and forming an interstitial space between the inner casing and the outer wall, the inner casing providing a protective barrier for an equipment cavity formed within the inner casing;

an intake chamber providing for passage of cooler air into the equipment cavity formed within the inner casing;

an exhaust chamber providing for passage of warmer air out of the equipment cavity formed within the inner casing; and a riser column having a stationary base structure and a movable riser structure, the movable riser structure moving relative to the stationary base structure between a first lowered position and a second raised position; and a backplane to mount electronics equipment in the equipment cavity;

wherein the riser column is configured to move between a first lowered position in the equipment cavity formed within the inner casing, and a second raised position for access to the electronics equipment mounted to the backplane.

19. The electronics equipment structure of claim 18, further comprising at least one ventilation fan mounted in the interstitial space between the inner casing and the outer wall, the at least one ventilation fan moving outside air into the equipment cavity to cool the electronics equipment therein.

20. The electronics equipment structure of claim 19, further comprising at least a first vent opening formed through the inner casing for moving outside air into the equipment cavity, and at least a second vent opening formed through the inner casing for expelling warmer air out of the equipment cavity, to cool the electronics equipment therein.

* * * * *